US012701743B2

(12) United States Patent
Yen et al.

(10) Patent No.: US 12,701,743 B2
(45) Date of Patent: Aug. 4, 2026

(54) SEMICONDUCTOR DEVICE HAVING ISOLATION STRUCTURE TO REDUCE CURRENT LEAKAGE

(71) Applicant: TAIWAN SEMICONDUCTOR MANUFACTURING COMPANY, LTD., Hsinchu (TW)

(72) Inventors: Hung-Yu Yen, Hsinchu (TW); Wei-Ting Yeh, Hsinchu (TW); Ko-Feng Chen, Hsinchu (TW); Keng-Chu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 937 days.

(21) Appl. No.: 17/824,669

(22) Filed: May 25, 2022

(65) Prior Publication Data

US 2023/0387312 A1     Nov. 30, 2023

(51) Int. Cl.
H10D 30/67      (2025.01)
H01L 21/02      (2006.01)
H10D 30/01      (2025.01)
H10D 62/10      (2025.01)
H10D 64/01      (2025.01)
(Continued)

(52) U.S. Cl.
CPC ....... H10D 30/6713 (2025.01); H10D 30/031 (2025.01); H10D 30/6735 (2025.01); H10D 30/6757 (2025.01); H10D 62/118 (2025.01); H10D 64/017 (2025.01); H10P 14/6532 (2026.01); H10P 14/6546 (2026.01);
(Continued)

(58) Field of Classification Search
CPC ............. H10D 30/6713; H10D 30/031; H10D 30/6735; H10D 30/6757; H10D 62/118; H10D 64/017; H10D 30/014; H10D 30/43; H10D 62/116; H10D 62/121; H10D 62/822; H10D 64/251; H10D 64/258; H10D 84/85; H01L 21/02178; H01L 21/02181; H01L 21/02189; H01L 21/0234; H01L 21/02359; H01L 21/02356; H01L 23/5286; H01L 23/535; H01L 21/76897; H01L 21/76895; H01L 23/5283; B82Y 10/00; H10F 39/182; H10F 39/805; H10F 39/8063
See application file for complete search history.

(56) References Cited

U.S. PATENT DOCUMENTS 10,461,154 B1* 10/2019 Song ................. H10D 30/6735

* cited by examiner

*Primary Examiner* — Jessica S Manno
*Assistant Examiner* — Ricky Verdes
(74) *Attorney, Agent, or Firm* — Birch, Stewart, Kolasch & Birch, LLP

(57)          ABSTRACT

A method is provided for forming a semiconductor device. A fin feature is formed on a semiconductor substrate, and a dummy gate feature is formed over the fin feature. The fin feature includes a sacrificial portion disposed over the semiconductor substrate, and a fin portion disposed over the sacrificial portion. The dummy gate feature is connected to the fin feature and the semiconductor substrate. Then, the sacrificial portion is removed to form a gap between the semiconductor substrate and the fin portion. A dielectric isolation layer is formed to fill the gap for electrically isolating the fin portion from the semiconductor substrate. Subsequently, source/drain features are formed over the dielectric isolation layer, and the dummy gate feature is processed to form a gate electrode feature on the fin portion.

20 Claims, 19 Drawing Sheets

(51) Int. Cl.
    *H10P 14/60*         (2026.01)
    *H10P 14/692*      (2026.01)

(52) U.S. Cl.
    CPC .. *H10P 14/69391* (2026.01); *H10P 14/69392* (2026.01); *H10P 14/69395* (2026.01)

| Form fin features on substrate, and dummy gate feature on fin features | S1 |

| Remove sacrificial portion of each fin feature | S2 |

| Form dielectric isolation layer to fill gaps | S3 |

| Form gate spacer | S4 |

| Transform dielectric isolation layer into hybrid structure | S5 |

| Form S/D features | S6 |

| Form gate feature | S7 |

Deposit dielectric isolation layer —— S31

Coat masking layer —— S32

Perform etching back on masking layer —— S33

Etch unmasked dielectric isolation layer —— S34

Remove masking layer —— S35

SEMICONDUCTOR DEVICE HAVING ISOLATION STRUCTURE TO REDUCE CURRENT LEAKAGE

BACKGROUND

The semiconductor integrated circuit (IC) industry has over the past decades experienced tremendous advancements and is still experiencing vigorous development. With the dramatic advances in IC design, new generations of ICs have smaller and more complex structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
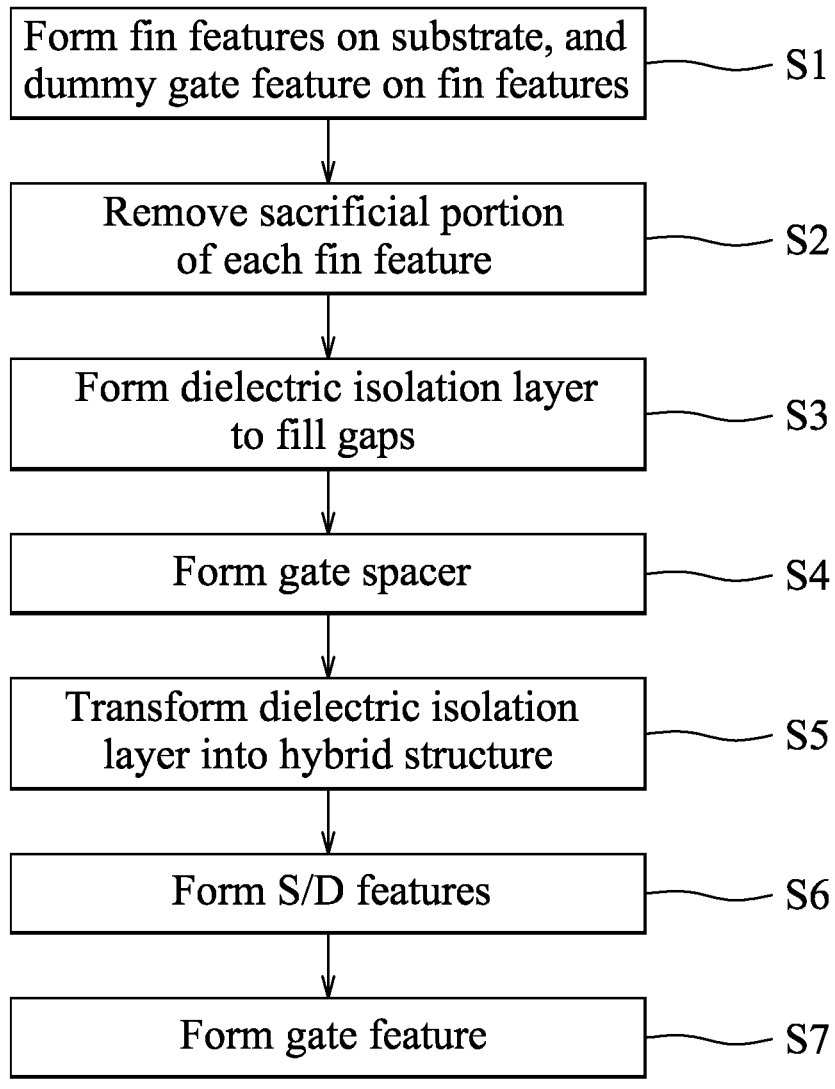
FIG. 1 is a flow chart illustrating steps of a method for forming a semiconductor circuit structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the advancement of semiconductor manufacturing technology, dimensions of semiconductor devices become smaller and smaller. The shrinkage of the device dimensions may cause some issues, such as current leakage, so different device structures are developed to overcome those issues. For example, three-dimensional (3D) transistors, such as fin field-effect transistors (FinFETs) and gate-all-around field-effect transistors (GAAFETs), are developed to achieve better electrical control over the channel than planar transistors. When the device dimensions become even smaller, distances among source/drain regions and among the transistors may be so small that current leakage among the source/drain regions and channel regions may be induced in the substrate, called mesa leakage.

In order to reduce the mesa leakage, a semiconductor circuit structure is proposed to form a bottom dielectric isolation (BDI) between the transistors and the substrate in accordance with some embodiments, so as to electrically isolate the transistors from the substrate.

FIG. 1 illustrates steps of a method for forming the semiconductor circuit structure in accordance with some embodiments. In the illustrative embodiment, the semiconductor circuit structure is exemplified to include a first semiconductor device and a second semiconductor device, each of which is a GAAFET, but this disclosure is not limited in this respect. In other embodiments, the semiconductor circuit structure may include other types of circuit components, such as FinFETs, other suitable components, or any combination thereof.

Figure 2:
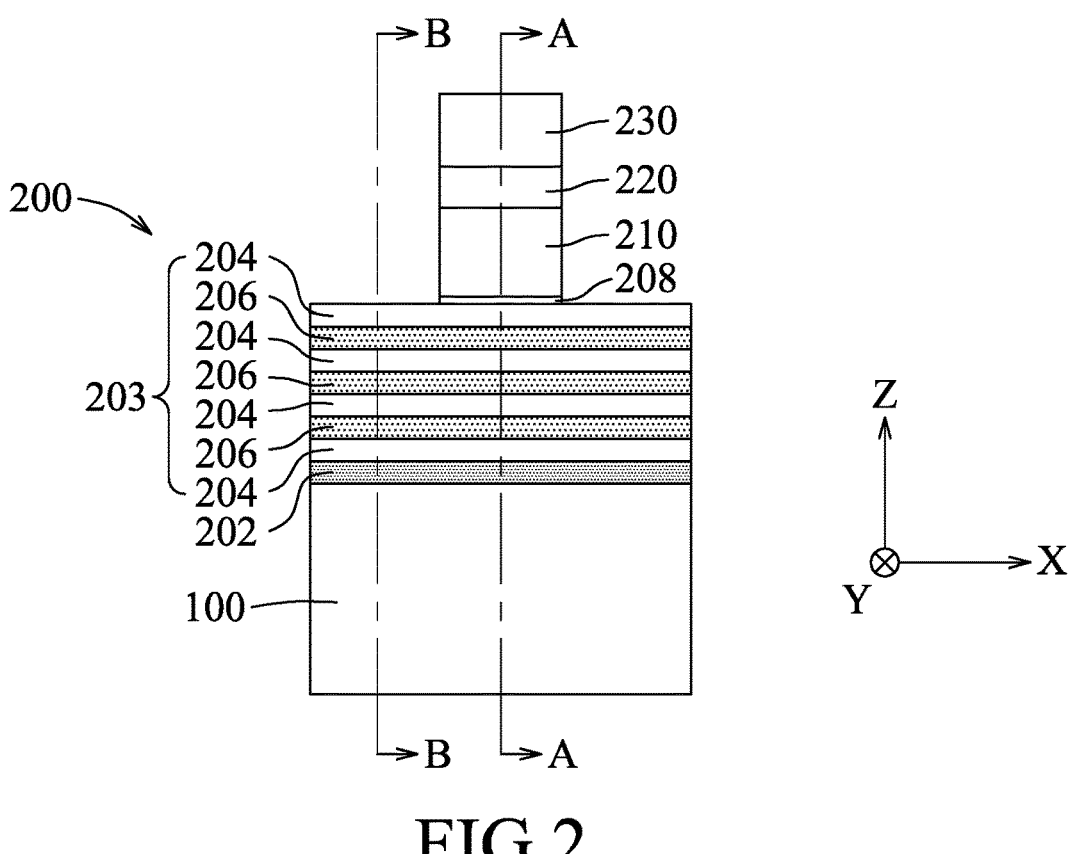
FIGS. 2 through 7 and 20 through 33 are schematic views illustrating the steps of the method in accordance with some embodiments.
Figure 3:
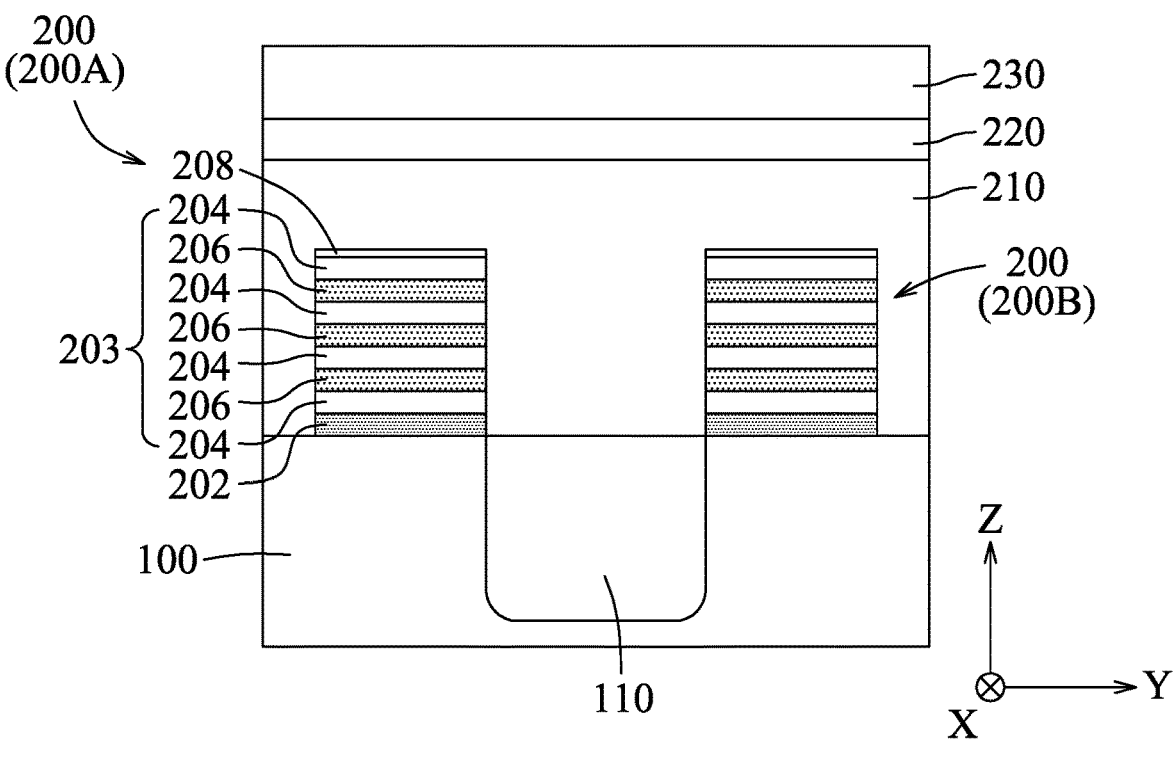
Figure 4:
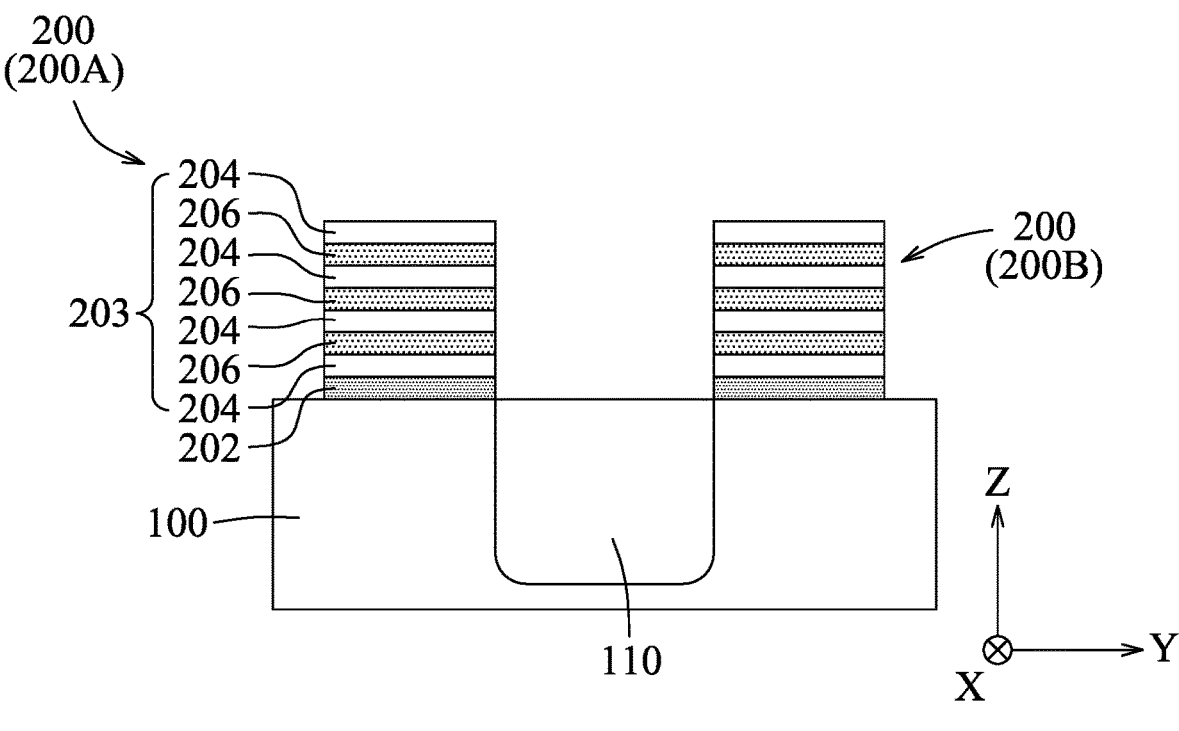

In step S1, as illustrated in FIGS. 2 through 4, multiple fin features 200 are formed over a semiconductor substrate 100, and a dummy gate feature 210 is formed over the fin features 200. To be specific, the dummy gate feature 210 is connected to a top surface and opposite lateral surfaces of each of the fin features 200, and is connected to the semiconductor substrate 100. FIG. 2 is an X-cut view of an intermediate structure of the semiconductor circuit structure, which is a sectional view across the dummy gate feature 210 and one of the fin features 200 in an X-axis direction. FIG. 3 is a first Y-cut view of the intermediate structure of the semiconductor circuit structure, which is a sectional view across the dummy gate feature 210 and the fin features 200 in a Y-axis direction, taken along line A-A in FIG. 2. FIG. 4 is a second Y-cut view of the intermediate structure of the semiconductor circuit structure, which is a sectional view across the fin features 200 in the Y-axis direction, taken along line B-B in FIG. 2. The X-axis direction and the Y-axis direction are perpendicular to each other and to a Z-axis direction.

The semiconductor substrate 100 may be a bulk semiconductor substrate or a semiconductor-on-insulator (SOI) substrate, which may be doped (e.g., with a p-type or an n-type dopant) or undoped. In some embodiments, an SOI substrate includes a layer of a semiconductor material formed on an insulator layer. The insulator layer may be a buried oxide (BOX) layer, a silicon oxide layer or any other suitable layer. The insulator layer may be provided on a suitable substrate, such as silicon, glass or the like. The semiconductor substrate 100 may be made of a suitable semiconductor material, such as silicon or the like. In some embodiments, the semiconductor substrate 100 is a silicon wafer; and in other embodiments, the semiconductor substrate 100 is made of a compound semiconductor such as silicon carbide, gallium arsenide, indium arsenide, indium phosphide or other suitable materials. In still other embodiments, the semiconductor substrate 100 is made of an alloy semiconductor such as GaAsP, AlInAs, AlGaAs, GaInAs, GaInP, GaInAsP or other suitable materials.

In some embodiments, the semiconductor substrate 100 includes various p-type doped regions and/or n-type doped regions, such as p-type wells, n-type wells, p-type source/drain features and/or n-type source/drain features, formed by a suitable process such as ion implantation, thermal diffusion, a combination thereof, or the like. In some embodiments, the semiconductor substrate 100 may include other functional elements such as resistors, capacitors, diodes, transistors, and/or the like. The transistors are, for example, field effect transistors (FETs), such as planar FETs and/or 3D FETs (e.g., FinFETs, GAAFETs). The semiconductor substrate 100 may include lateral isolation features (e.g., shallow trench isolation (STI)) configured to separate various functional elements formed on and/or in the semiconductor substrate 100.

In some embodiments, the dummy gate feature 210 may be formed by: depositing an etch stop layer on the fin features 200; depositing a layer of a dummy gate material on the etch stop layer; depositing a hard mask layer on the layer of the dummy gate material; depositing a dielectric layer on the hard mask layer; etching parts of the dielectric layer, the hard mask layer and the layer of the dummy gate material to form a stack of the dielectric layer 230, the hard mask layer 220 and the dummy gate feature 210 as shown in FIGS. 2 and 3; and removing a part of the etch stop layer that is outside of a coverage of the stack of the dielectric layer 230, the hard mask layer 220 and the dummy gate feature 210, and a remaining part 208 of the etch stop layer is disposed between the dummy gate feature 210 and top surfaces of the fin features 200. The etch stop layer 208 may include, for example, silicon oxide, silicon nitride, silicon oxynitride, fluorosilicate glass (FSG), a low-k material, other suitable materials, or any combination thereof. The dummy gate feature 210 may include, for example, polysilicon, other suitable materials, or any combination thereof. The hard mask layer 220 may include, for example, silicon oxide, silicon nitride, oxygen-doped silicon nitride, carbon-doped silicon nitride, silicon carbide, other suitable materials, or any combination thereof. The dielectric layer 230 may include, for example, silicon oxide, silicon nitride, silicon oxynitride, FSG, a low-k material, other suitable materials, or any combination thereof.

In the illustrative embodiment, the fin features 200 include a first fin feature 200A and a second fin feature 200B, and a shallow trench isolation (STI) feature 110 is formed in the semiconductor substrate 100 between the first fin feature 200A and the second fin feature 200B. Each of the fin features 200 includes a sacrificial portion 202 and a fin portion 203. The fin portion 203 is a multilayer stack that includes multiple semiconductor layers 204 and multiple sacrificial layers 206 that are alternately stacked together, where the semiconductor layers 204 include a semiconductor material different from that of the sacrificial layers 206 and that of the sacrificial portion 202. In some embodiments, the sacrificial layers 206 and the sacrificial portion 202 are all doped layers that have the same base material and the same dopant material, but a doping concentration of the sacrificial portion 202 is different from that of the sacrificial layers 206. In some embodiments, a difference between the doping concentrations of the sacrificial portion 202 and the sacrificial layers 206 is equal to or greater than 10%, so as to achieve good etch selectivity between the sacrificial portion 202 and the sacrificial layers 206 in subsequent process steps. In the illustrative embodiment, the semiconductor layers 204 are made of silicon, and the sacrificial layers 206 and the sacrificial portion 202 are made of germanium-doped silicon (SiGe, where silicon is the base material and germanium is the dopant material), with the sacrificial portion 202 having a higher concentration of germanium than the sacrificial layers 206, but this disclosure is not limited in this respect. In other embodiments, the sacrificial portion 202, the semiconductor layers 204 and the sacrificial layers 206 may include other suitable materials, such as a compound semiconductor material (e.g., silicon carbide, gallium arsenide, gallium phosphide, indium phosphide, indium arsenide, indium antimonide, and/or other suitable materials), an alloy semiconductor material (e.g., GaAsP, AlInAs, AlGaAs, InGaAs, GaInP, GaInAsP), other suitable materials, or any combination thereof.

Figure 5:
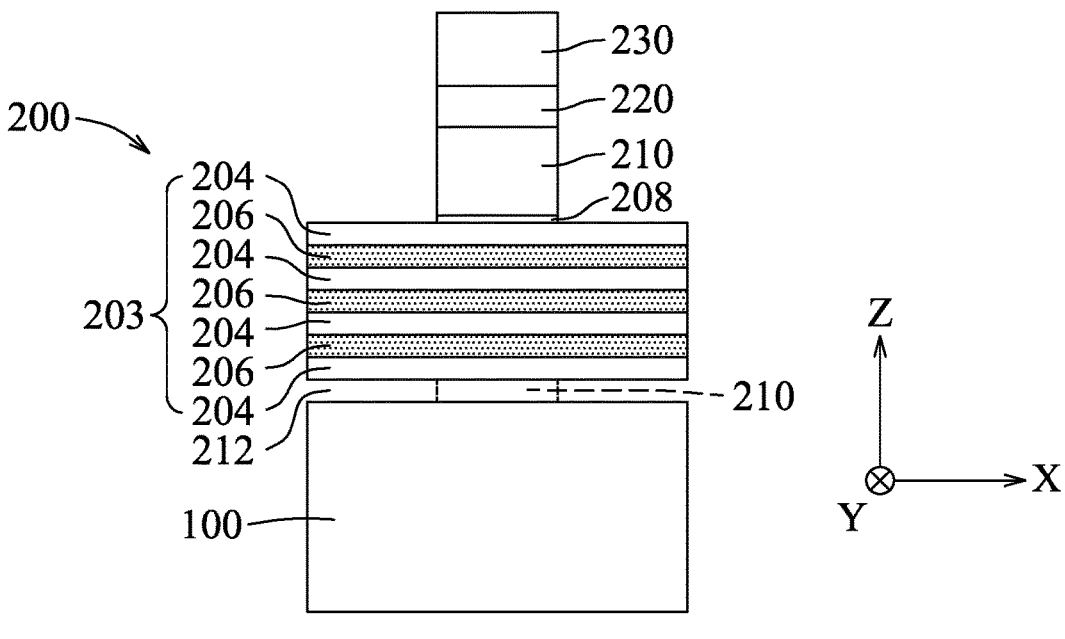
Figure 6:
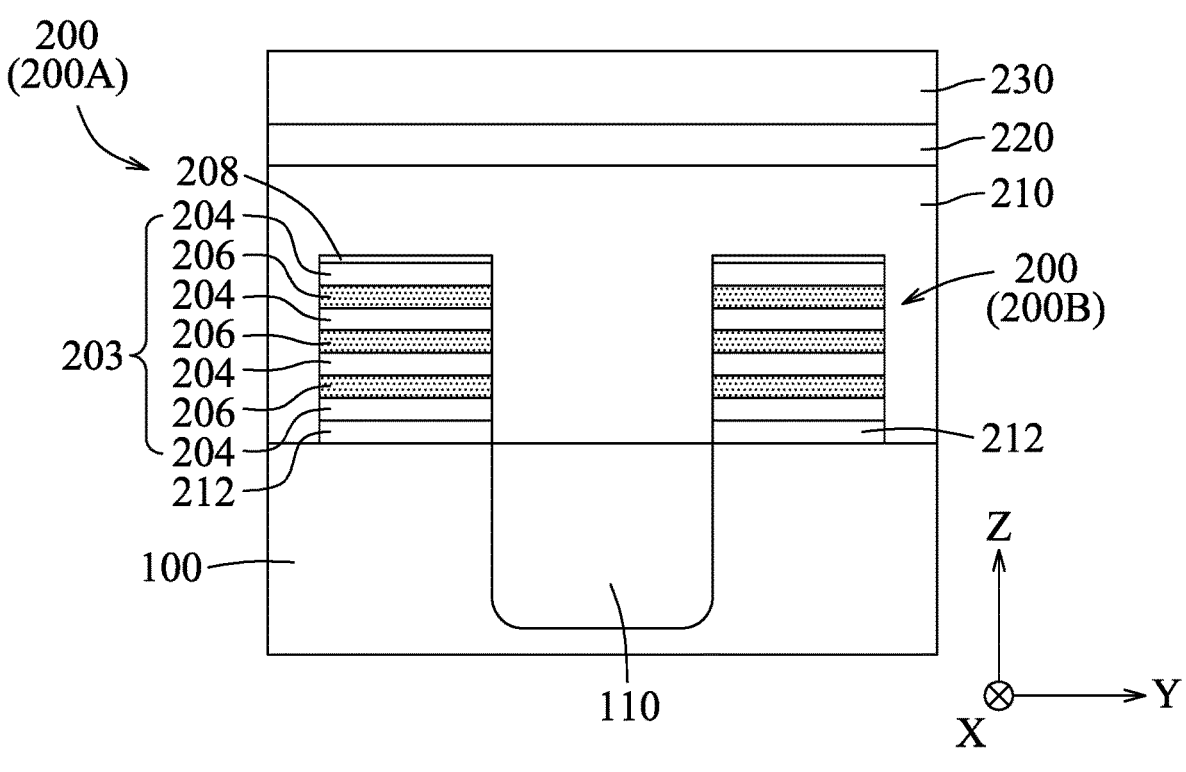
Figure 7:
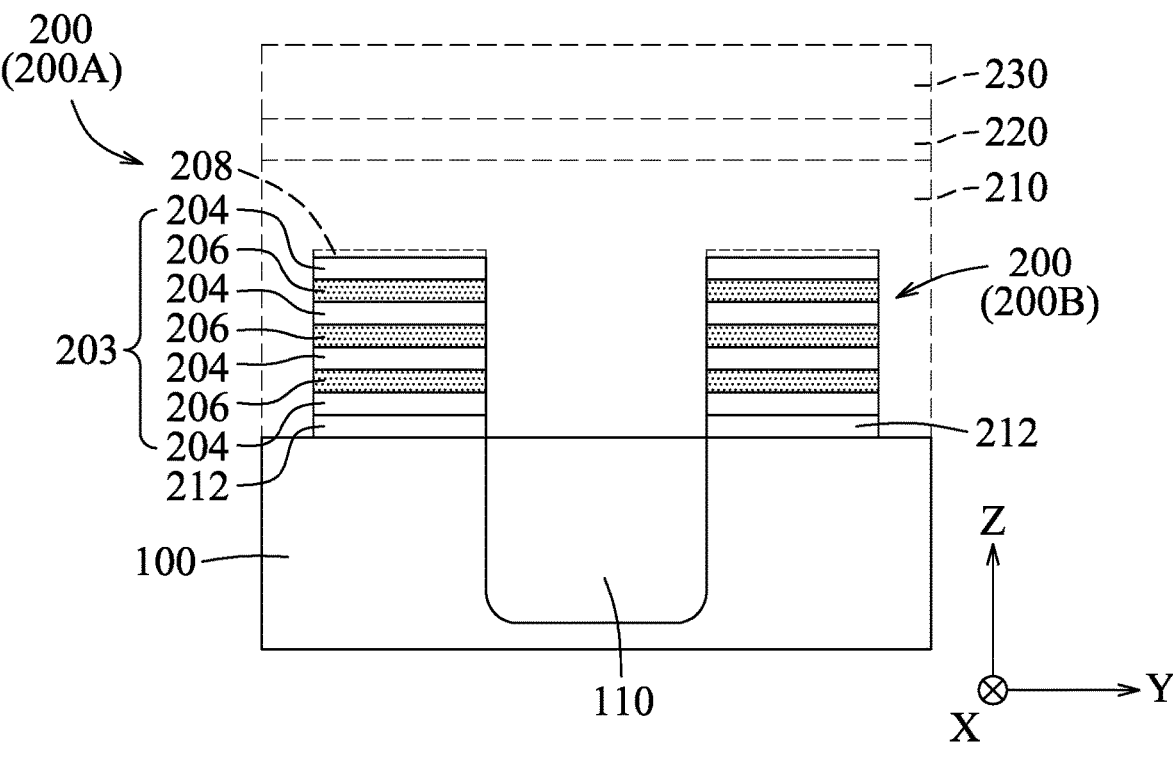

In step S2, as illustrated in FIGS. 5 through 7, the sacrificial portion 202 (see FIGS. 2 through 4) of each fin feature 200 is removed to form a gap 212 between the semiconductor substrate 100 and the fin portion 203 of each fin feature 200, where FIGS. 5 through 7 respectively illustrate the X-cut view, the first Y-cut view and the second Y-cut view of an intermediate structure of the semiconductor circuit structure at this stage. In the illustrative embodiment, for each of the fin features 200, since the sacrificial portion 202 and the sacrificial layers 206 of the fin portion 203 have different doping concentrations, an appropriate etching technique may be adopted to achieve selective etching to remove only the sacrificial portion 202 while the sacrificial layers 206 are maintained. In some embodiments, the removal of the sacrificial portion 202 may be performed using, for example, isotropic radical etching, other suitable techniques, or any combination thereof. It can be seen from FIGS. 5 through 7 that the fin portions 203 of the fin features 200 are supported by the dummy gate feature 210 that is connected to the semiconductor substrate 100 and the fin features 200, so the fin portions 203 will not collapse after removal of the sacrificial portions 202 from the fin features 200.

Figure 8:
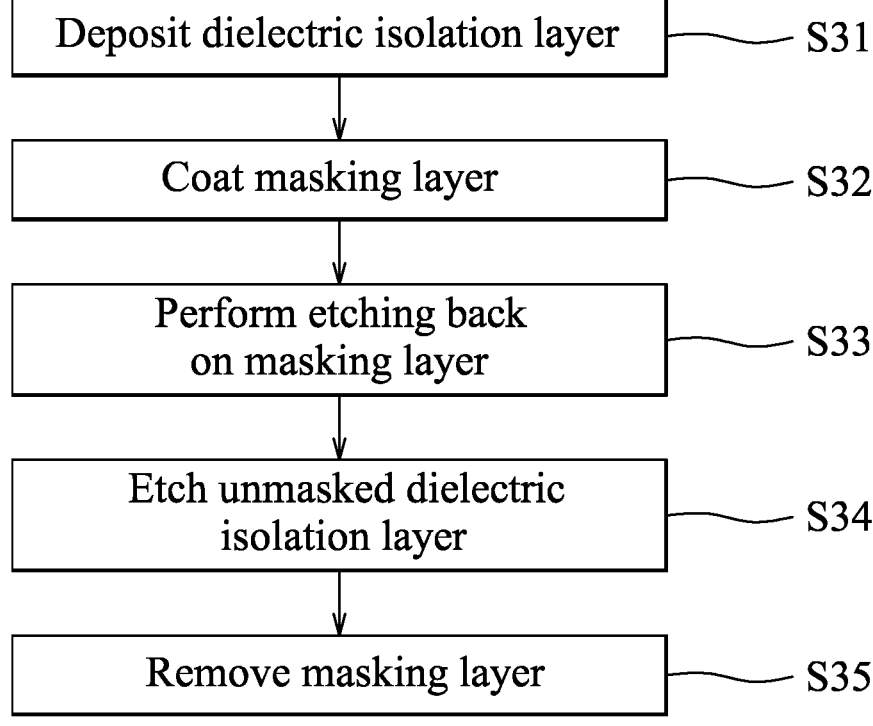
FIG. 8 is a flow chart illustrating steps of an exemplary approach to form a dielectric isolation layer in accordance with some embodiments.
Figure 15:
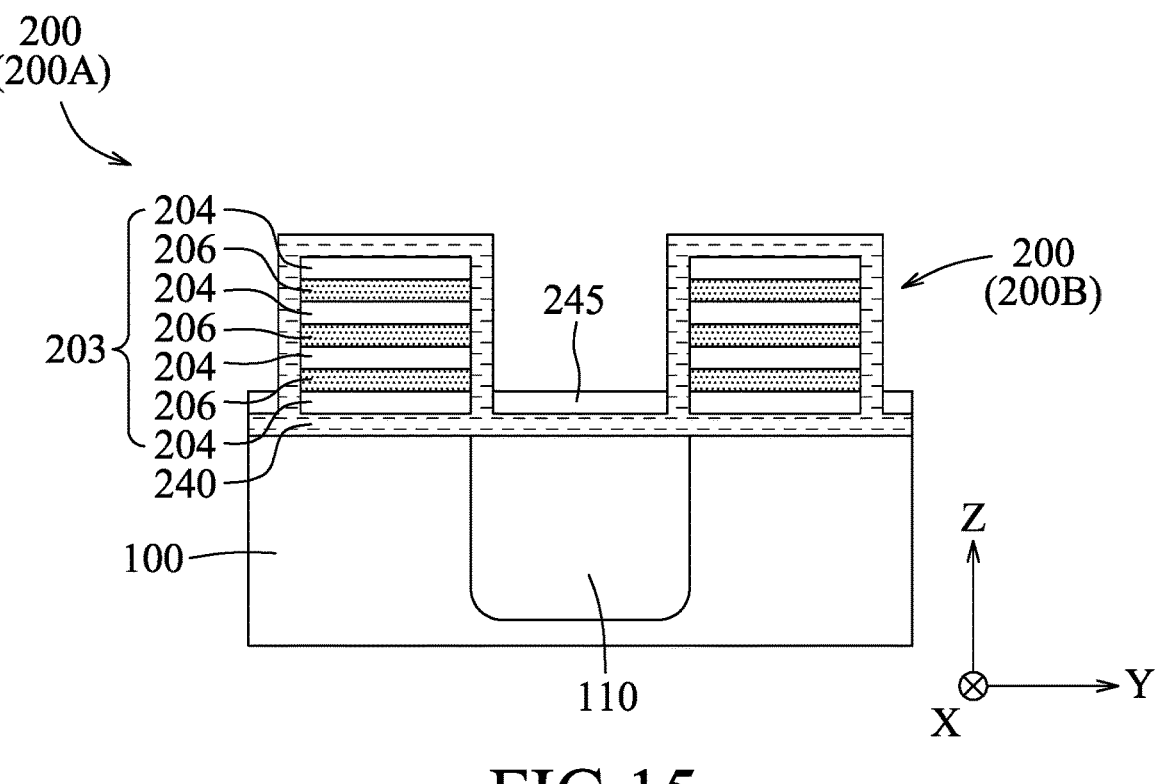
Figure 16:
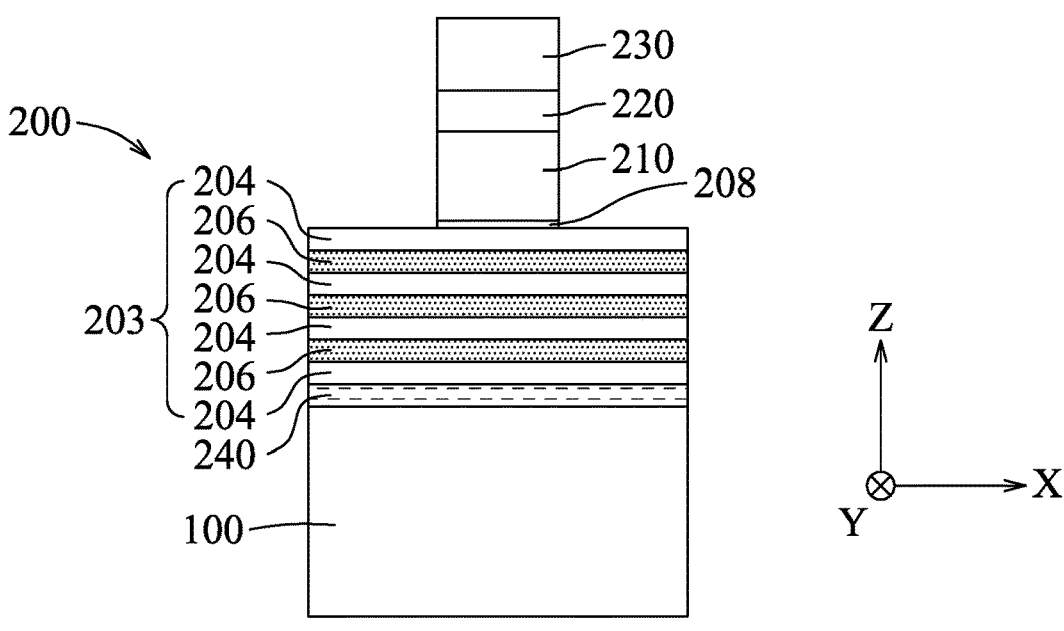
Figure 17:
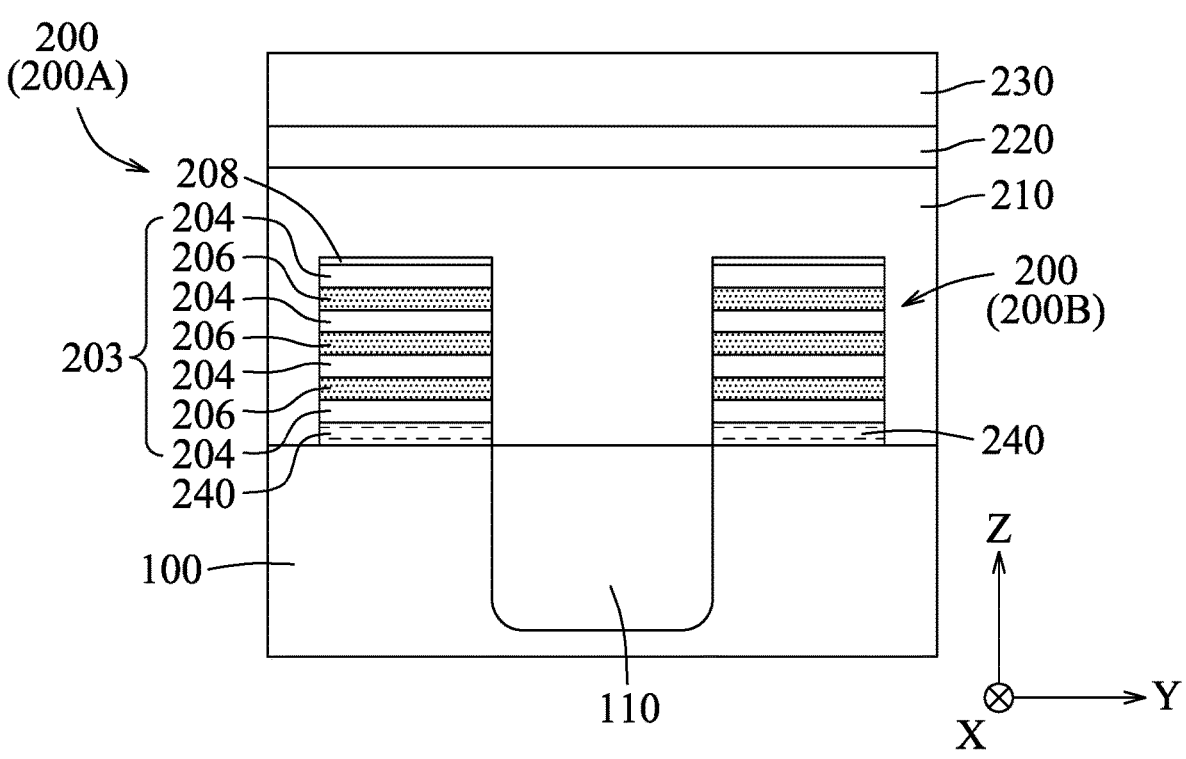
Figure 18:
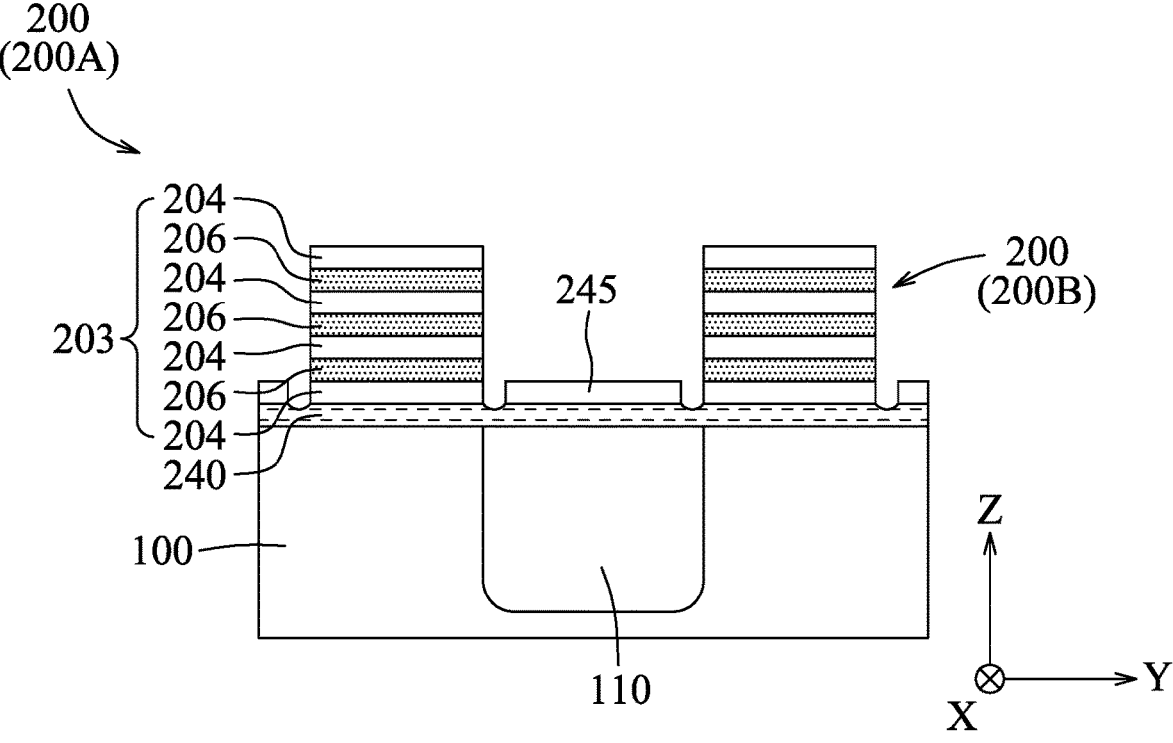
Figure 19:
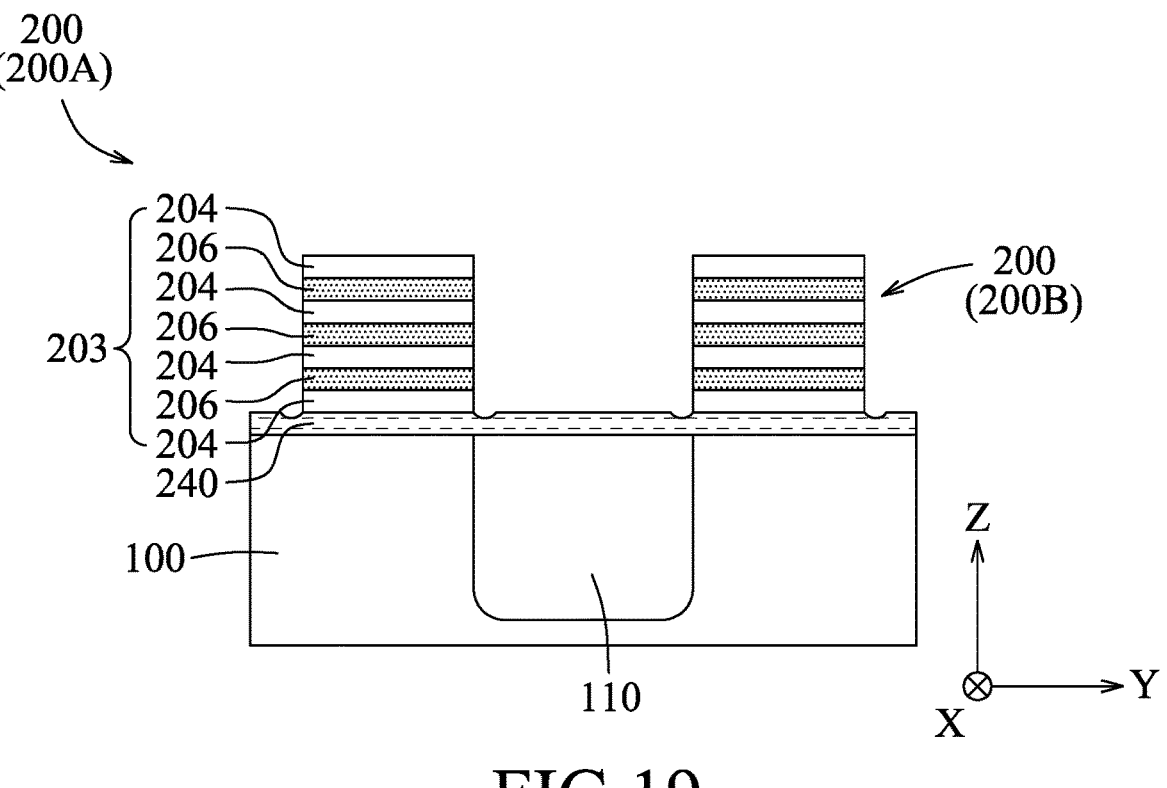

In step S3, as illustrated in FIGS. 16, 17 and 19, a dielectric isolation layer 240 is formed to fill the gaps 212 for electrically isolating the fin portions 203 of the fin features 200 from the semiconductor substrate 100, where FIGS. 16, 17 and 19 respectively illustrate the X-cut view, the first Y-cut view and the second Y-cut view of an intermediate structure of the semiconductor circuit structure at this stage. FIG. 8 is a flow chart that cooperates with FIGS. 9 through 19 to illustrate an exemplary approach for forming the dielectric isolation layer 240 as shown in FIGS. 16, 17 and 19.

Figure 9:
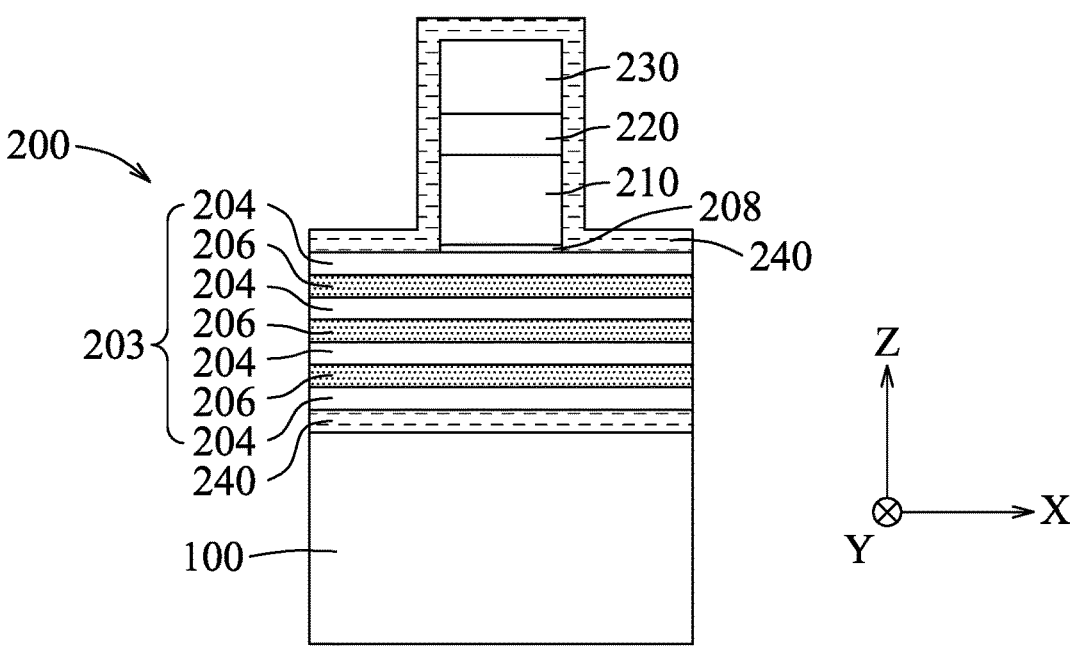
FIGS. 9 through 19 are schematic view illustrating the exemplary approach in accordance with some embodiments.
Figure 10:
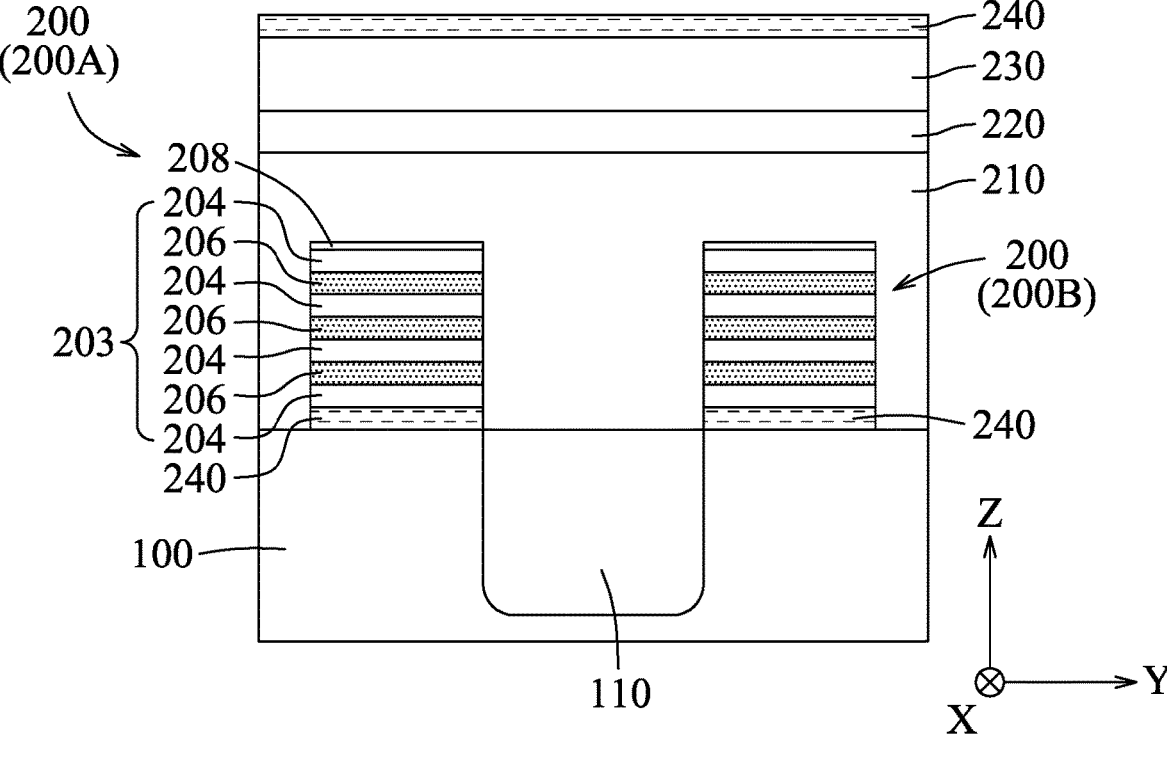
Figure 11:
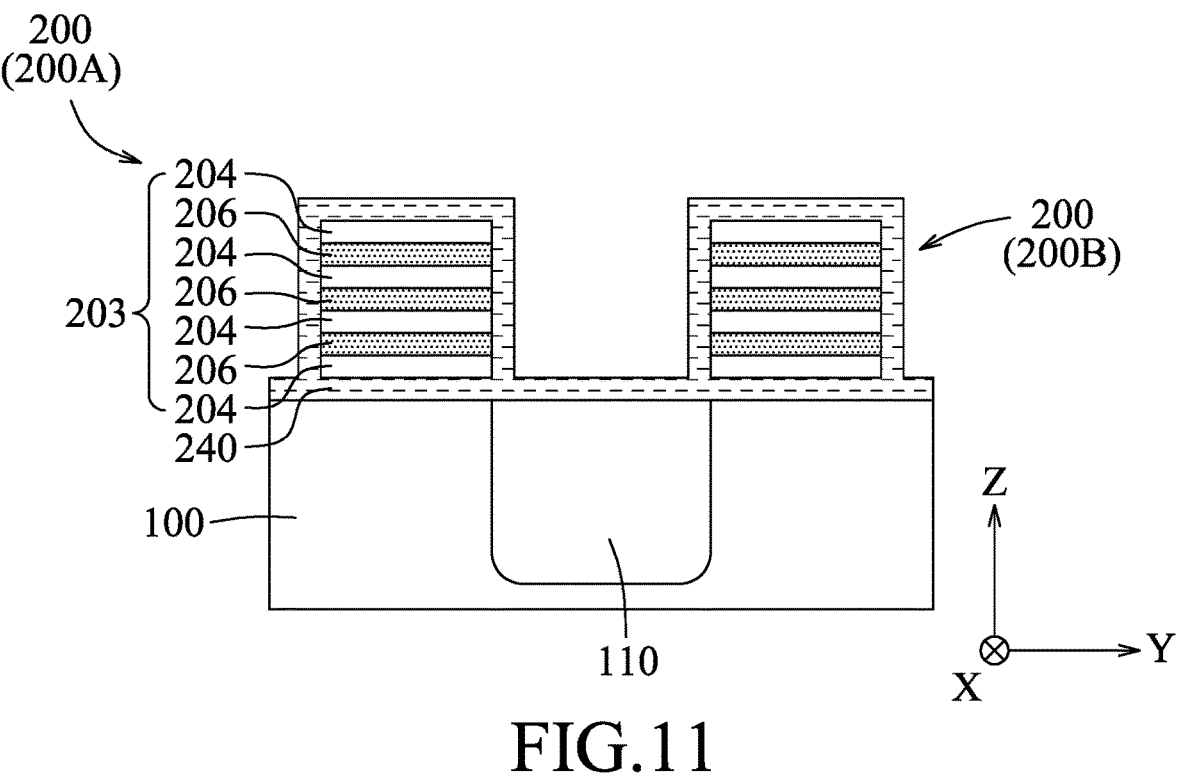

In step S31, as illustrated in FIGS. 9 through 11, the dielectric isolation layer 240 is deposited, and the gaps 212 between the semiconductor substrate 100 and the fin portions 203 of the fin features 200 are thus filled with the dielectric isolation layer 240, where FIGS. 9 through 11 respectively illustrate the X-cut view, the first Y-cut view and the second Y-cut view of an intermediate structure of the semiconductor circuit structure at this stage. In addition, the dielectric isolation layer 240 is also conformally formed on the semiconductor substrate 100, the fin features 200 and the dielectric layer 230. In some embodiments, the dielectric isolation layer 240 may include, for example, a metal-based oxide, a metal-based nitride, other suitable materials, or any combination thereof, which is capable of electrically isolating the fin portions 203 of the fin features 200 from the semiconductor substrate 100. In some embodiments, the metal-based oxide or the metal-based nitride used in the dielectric isolation layer 240 may include a metal component such as Al, Hf, Zr, other suitable materials, or any combination thereof, so as to have, in comparison to silicon-based dielectric material, better electrical isolation property to reduce current leakage, better thermal conductivity to enhance heat dissipation, and/or better resistance against subsequent etching processes (e.g., spacer trimming, patterning of source/drain epitaxy, precleaning of source/drain epitaxy, etc.). In some embodiments, the dielectric isolation layer 240 may be formed using, for example, atomic layer deposition (ALD), chemical vapor deposition (CVD), other suitable techniques, or any combination thereof. In the illustrative embodiment, the dielectric isolation layer 240 may be an amorphous $Al_xO_y$ (aluminum oxide) layer or an amorphous $Al_xN_y$ (aluminum nitride) layer, but this disclosure is not limited in this respect. In a case that the dielectric isolation layer 240 is an aluminum oxide layer, the film deposition may use, for example, trimethylaluminum (TMA) and $O_3$ or $O_2$, other suitable gases, or any combination thereof. In a case that the dielectric isolation layer 240 is an aluminum nitride layer, the film deposition may use, for example, trimethylaluminum (TMA) and $NH_3$, other suitable gases, or any combination thereof.

Figure 12:
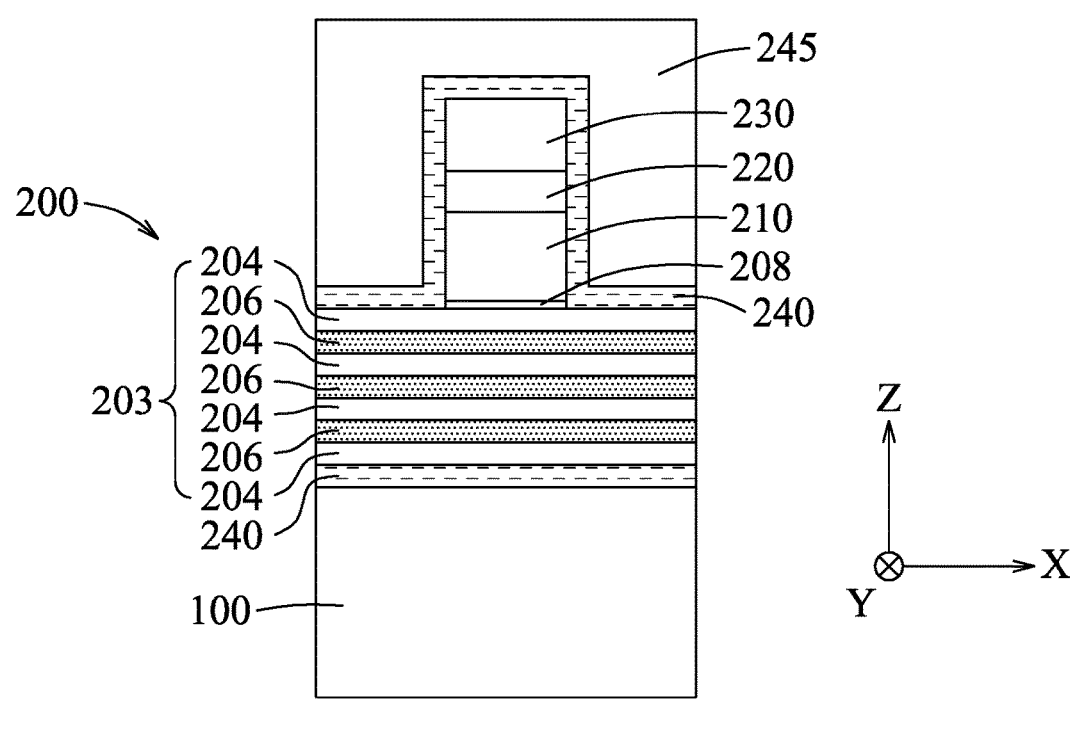
Figure 13:
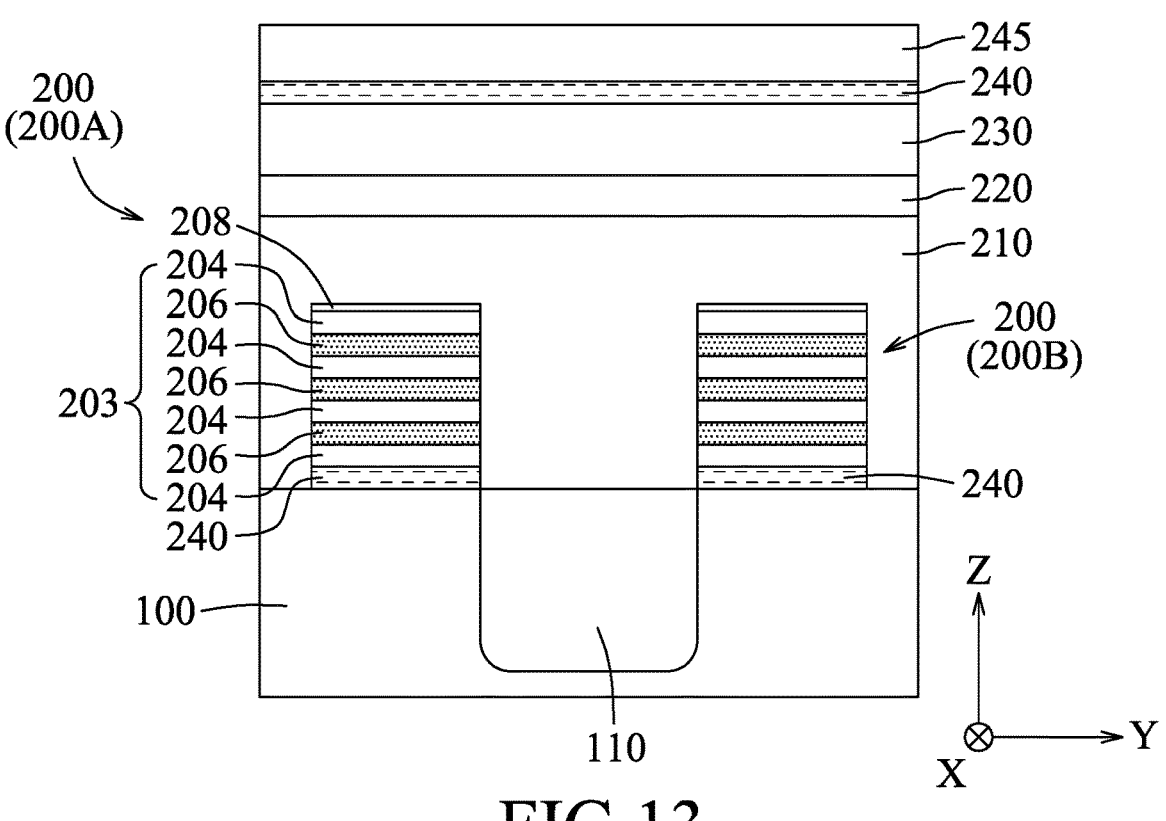
Figure 14:
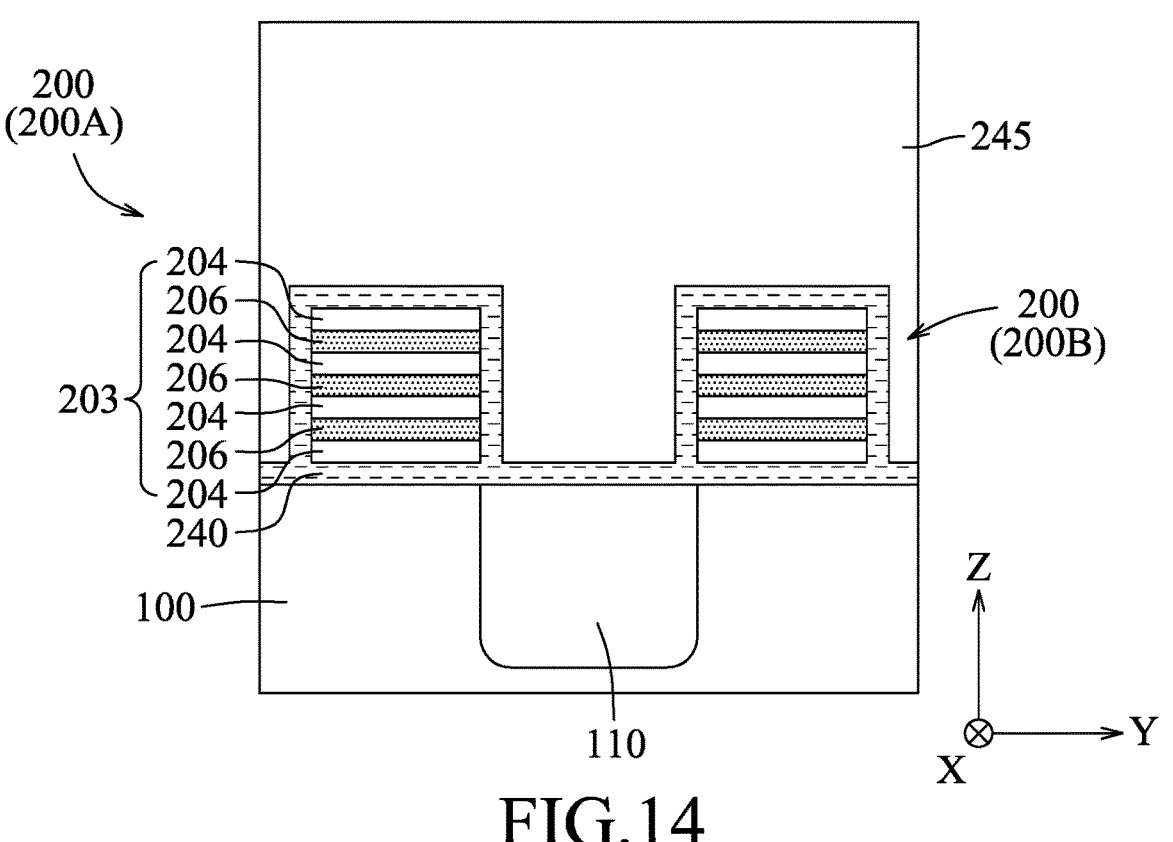

In step S32, as illustrated in FIGS. 12 through 14, a masking layer 245 is coated onto the dielectric isolation layer 240, where FIGS. 12 through 14 respectively illustrate the X-cut view, the first Y-cut view and the second Y-cut view of an intermediate structure of the semiconductor circuit structure at this stage. In some embodiments, the masking layer 245 is made of, for example, an organic material such as a photoresist material, other suitable materials, or any combination thereof, and is formed using, for example, spin coating, other suitable techniques, or any combination thereof. As illustrated in FIG. 14, the masking layer 245 is filled into a space between the first fin feature 200A and the second fin feature 200B.

In step S33, as illustrated in FIG. 15, an etching back process is performed on the masking layer 245 to remove a portion of the masking layer 245 that is disposed over the fin features 200 and the dummy gate feature 210 in such a way that a remaining portion of the masking layer 245 is disposed over a portion of the dielectric isolation layer 240 between the first fin feature 200A and the second fin feature 200B, where FIG. 15 illustrates the second Y-cut view of an intermediate structure of the semiconductor circuit structure at this stage. After the etching back process, the X-cut view and the first Y-cut view of the intermediate structure of the semiconductor circuit structure may be similar to those shown in FIGS. 9 and 10, respectively.

In step S34, as illustrated in FIGS. 16 through 18, a portion of the dielectric isolation layer 240 that is disposed over the fin features 200 and the dummy gate feature 210 (i.e., a portion that is outside a coverage of the remaining portion of the masking layer 245 and the fin features 200) is etched using, for example, dry etching, other suitable techniques, or any combination thereof, where FIGS. 16 through 18 respectively illustrate the X-cut view, the first Y-cut view and the second Y-cut view of an intermediate structure of the semiconductor circuit structure at this stage. As shown in FIG. 18, the dielectric isolation layer 240 may have some recesses between the masking layer 245 and the fin portions 203 of the fin features 200 because of the etching process.

In step S35, as illustrated in FIG. 19, the remaining portion of the masking layer 245 is removed, so as to reveal the portion of the dielectric isolation layer 240 between the first fin feature 200A and the second fin feature 200B, where FIG. 19 illustrates the second Y-cut view of an intermediate structure of the semiconductor circuit structure at this stage. The X-cut view and the first Y-cut view of the intermediate structure of the semiconductor circuit structure after step S35 may be similar to those shown in FIGS. 16 and 17, respectively. In some embodiments, the dielectric isolation layer 240 is formed to have a thickness in a range from about 3 nm to about 10 nm, so a thickness of the sacrificial portion

202 (see FIGS. 2 through 4) of each fin feature 200 may also fall within such a range (i.e., from about 3 nm to about 10 nm). An excessively small thickness (e.g., smaller than 3 nm) of the dielectric isolation layer 240 may be unable to achieve a desired electrical isolation, while an excessively large thickness (e.g., greater than 10 nm) of the dielectric isolation layer 240 may undesirably increase an overall resistive-capacitive delay for the semiconductor circuit structure because the dielectric isolation layer 240 usually has a high dielectric constant.

Figure 20:
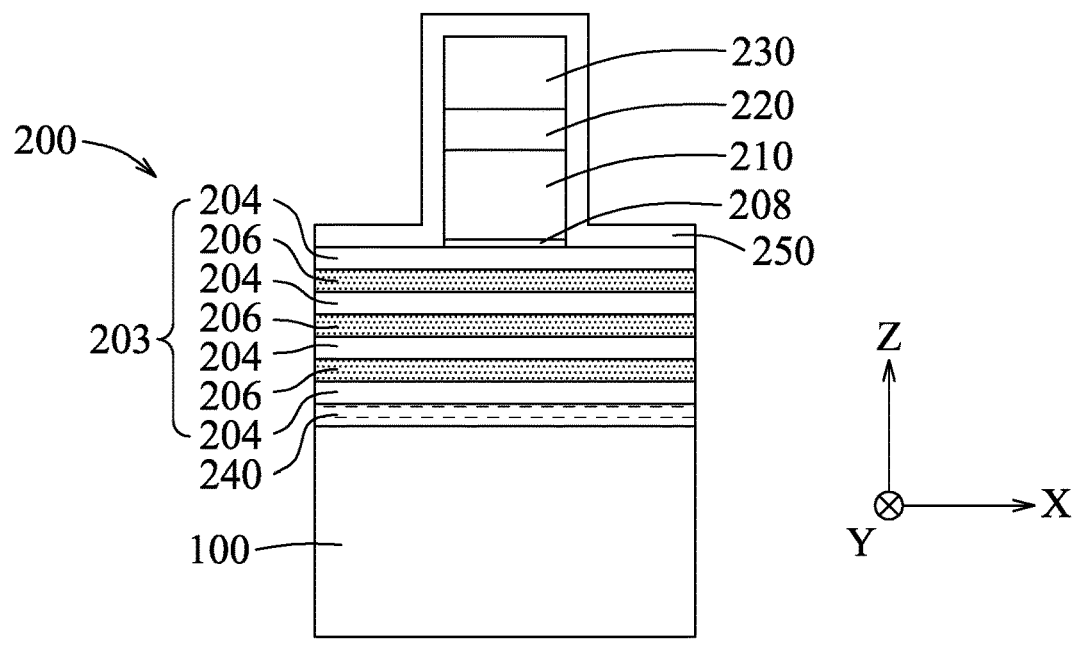
Figures 21, 22:
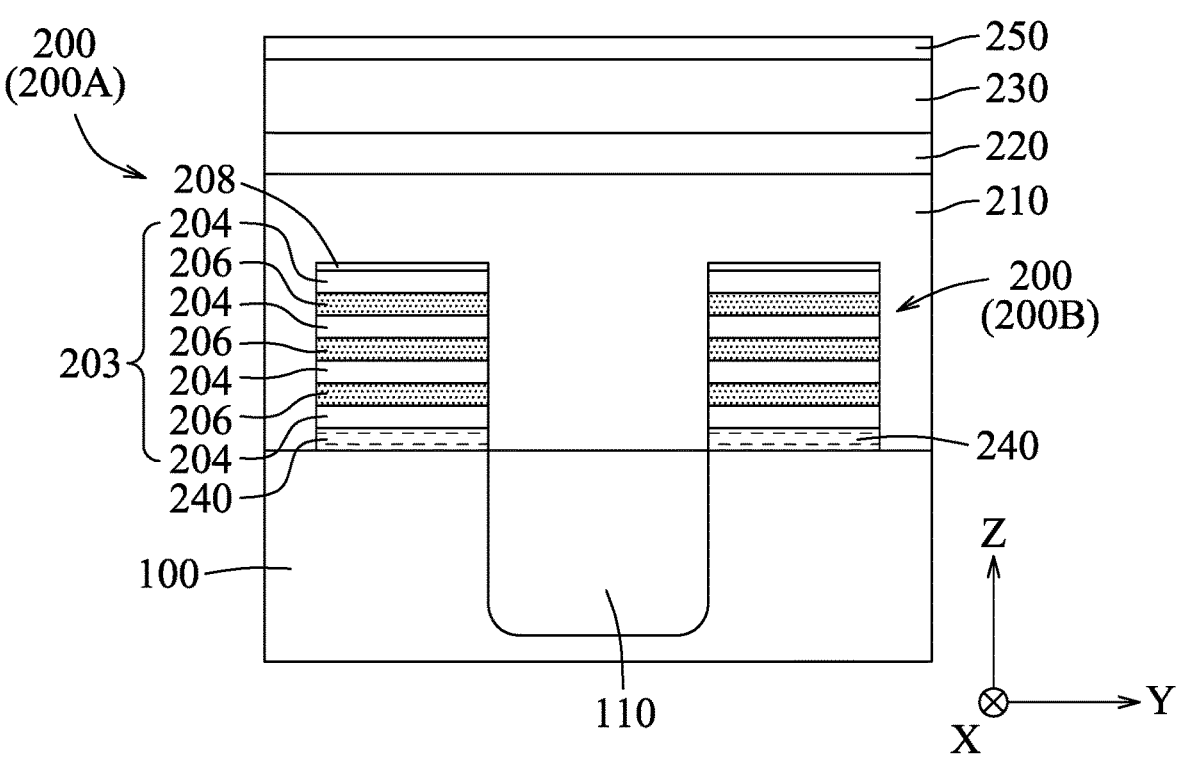
Figure 23:
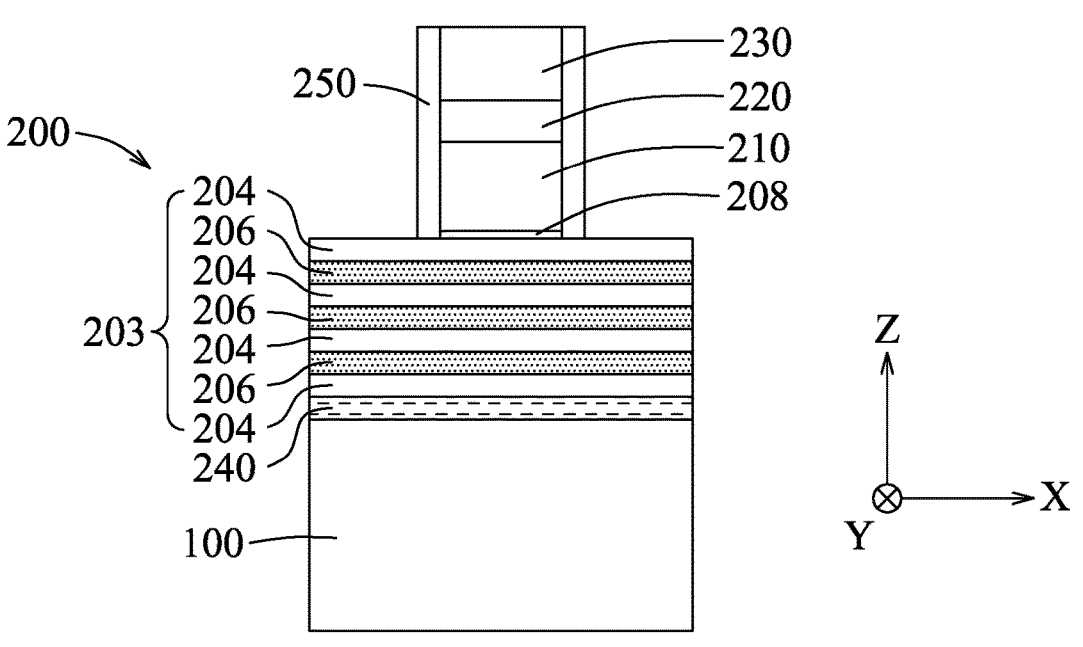
Figure 24:
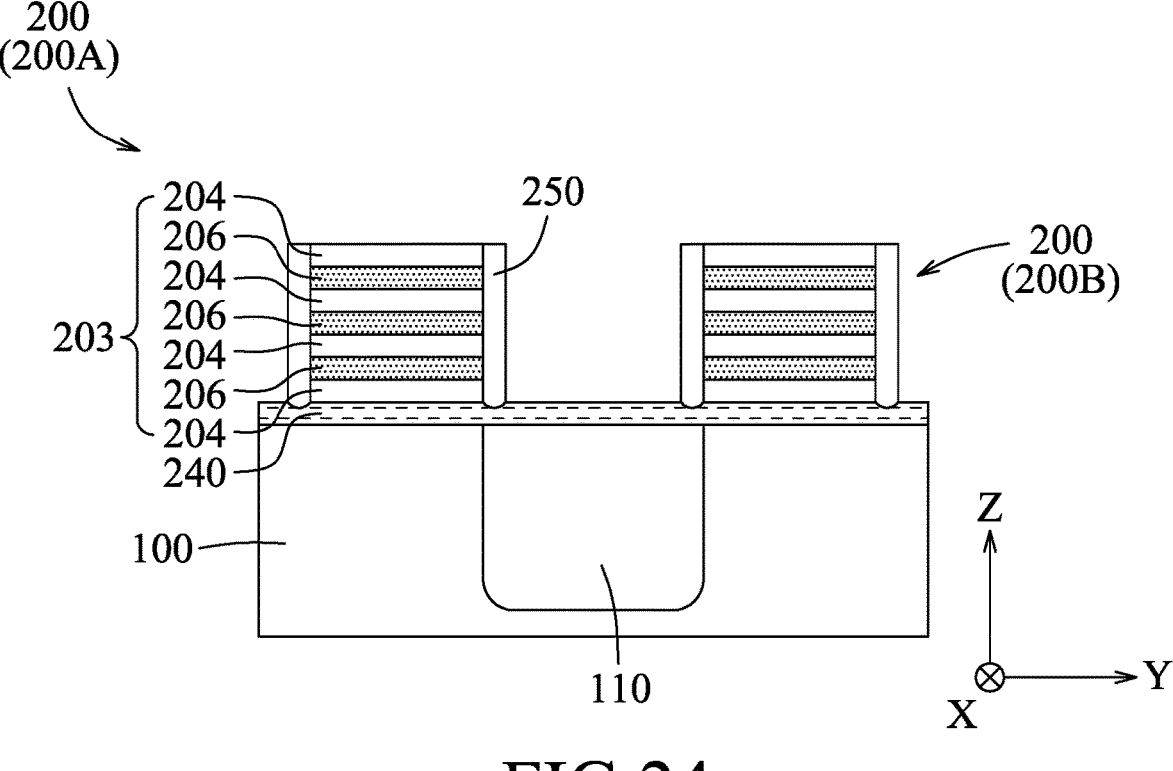

Referring to FIG. 1 again, in step S4, as illustrated in FIGS. 20 through 24, a gate spacer is formed to surround the stack of the dielectric layer 230, the hard mask layer 220 and the dummy gate feature 210. FIGS. 20 through 22 respectively illustrate the X-cut view, the first Y-cut view and the second Y-cut view of an intermediate structure of the semiconductor circuit structure for a step of depositing a gate spacer layer 250, where the gate spacer layer 250 is conformally formed over the dielectric isolation layer 240, the fin features 200 and the stack of the dielectric layer 230, the hard mask layer 220 and the dummy gate feature 210. In some embodiments, the gate spacer layer 250 may include, for example, silicon oxide, silicon nitride, silicon carbide, silicon oxynitride, silicon oxycarbide, other suitable materials, or any combination thereof, and may be deposited using, for example, CVD, ALD, other suitable techniques, or any combination thereof. FIGS. 23 and 24 respectively illustrate the X-cut view and the second Y-cut view of an intermediate structure of the semiconductor circuit structure for a step of etching the gate spacer layer 250 to form the gate spacer (also denoted using the reference numeral 250 hereinafter). In some embodiments, the gate spacer layer 250 may be etched using, for example, anisotropic dry etching such as reactive ion etching (RIE), atomic layer etching (ALE), other suitable techniques, or any combination thereof, so as to remove a portion of the gate spacer layer 250 that is disposed on top surfaces of the dielectric isolation layer 240, the fin features 200 and the dielectric layer 230, while a portion of the gate spacer layer 250 that is disposed on lateral surfaces of the fin features 200 and lateral surfaces of the stack of the dielectric layer 230, the hard mask layer 220 and the dummy gate feature 210 is maintained.

Figure 25:
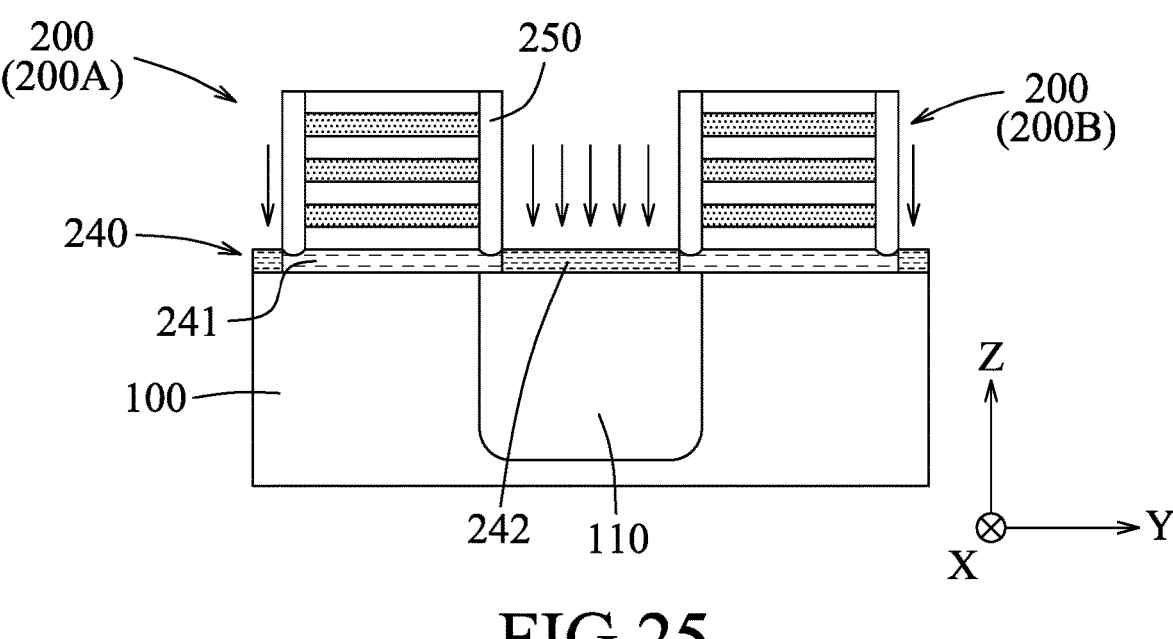

In step S5, as illustrated in FIG. 25, an exposed part of the dielectric isolation layer 240 that is outside of a coverage of the fin features 200 is transformed from a first dielectric material (i.e., a material of the dielectric isolation layer 240 formed in step S31) into a second dielectric material that is different from the first dielectric material, where FIG. 25 illustrates the second Y-cut view of an intermediate structure of the semiconductor circuit structure at this stage. In some embodiments, the transformation of the exposed part of the dielectric isolation layer 240 may be performed using, for example, a plasma treatment, other suitable techniques, or any combination thereof. The plasma treatment may be performed using, for example, inductively coupled plasma (ICP), capacitively coupled plasma (CCP), microwave (MW) plasma, electron cyclotron resonance (ECR) plasma, other types of plasma sources, or any combination thereof. In a case that the first dielectric material is metal-based oxide, the plasma treatment may use a gas including nitrogen, such as $N_2$, $NH_3$, other suitable gases, or any combination thereof to transform the metal-based oxide into metal-based nitride (i.e., the second dielectric material). In a case that the first dielectric material is metal-based nitride, the plasma treatment may use a gas including oxygen, such as $O_2$, $O_3$, other suitable gases, or any combination thereof to transform the metal-based nitride into metal-based oxide (i.e., the second dielectric material). In such an approach, the first dielectric material and the second dielectric material may have the same metal component. The plasma treatment may either be a single-step plasma treatment or a multi-step plasma treatment, and parameters of the plasma treatment such as RF power, pressure, temperature, bias, diluted gas, etc., may be adjusted to acquire desired composition profile, thickness and film properties of the second dielectric material. In some embodiments, the multi-step plasma treatment may first use an ion plasma that has better directionality, and then use a radical plasma to achieve better film quality, but this disclosure is not limited in this respect. In some embodiments, the RF power of the plasma treatment is in a range from about 1 KW to about 4 KW. An excessively large RF power (e.g., greater than 4 KW) may cause damage to the dielectric isolation layer 240, while an excessively small RF power (e.g., smaller than 1 KW) may be unable to induce sufficient directionality and effective depth of the plasma. In some embodiments, the pressure of the plasma treatment is in a range from about 0.15 torr to about 2 torr. An excessively large pressure (e.g., greater than 2 torr) may be unable to induce sufficient directionality and effective depth of the plasma, while an excessively small pressure (e.g., smaller than 0.15 torr) may cause damage to the dielectric isolation layer 240. In some embodiments, the temperature of the plasma treatment is in a range from about 300° C. to about 500° C. due to concerns of thermal budget. In some embodiments, the bias power of the plasma treatment is in a range from about 100 W to about 600 W. An excessively large bias power (e.g., greater than 600 W) may cause damage to the dielectric isolation layer 240, while an excessively small bias power (e.g., smaller than 100 W) may be unable to cause sufficient directionality of the plasma, and may cause an insufficient depth of the transformation in the dielectric isolation layer 240. Selection of the diluted gas may be influence an efficiency of the plasma treatment. When the plasma treatment is used for oxidation, the diluted gas may include, for example, helium, other suitable elements, or any combination thereof, for achieving good process efficiency. When the plasma treatment is used for nitridation, the diluted gas may include, for example, argon, other suitable elements, or any combination thereof, for achieving good process efficiency. The transforming step is an optional step to convert the dielectric isolation layer 240 into a hybrid structure that has a first dielectric portion 241 made of the first dielectric material, and a second dielectric portion 242 made of the second dielectric material, where the first dielectric portion 241 is covered by the fin features 200, and the second dielectric portion 242 is outside of a coverage of the fin features 200. The hybrid structure may have advantages of both of the first dielectric material and the second dielectric material. In one embodiment, the first dielectric material is aluminum oxide, and the second dielectric material is aluminum nitride. In one embodiment, the first dielectric material is aluminum nitride, and the second dielectric material is aluminum oxide. In general, aluminum oxide has a better electrical isolation property than aluminum nitride, and aluminum nitride is better in thermal conductivity and etching resistance, so the hybrid structure of the dielectric isolation layer 240 can reduce the current leakage, while achieve good heat dissipation and good resistance against subsequent etching processes. In some embodiments, step S5 may further include an annealing process for crystallizing the dielectric isolation layer 240, so as to improve film properties of the dielectric isolation layer 240, such as the electrical isolation property, the thermal conductivity, etc. In the case that the dielectric isolation layer 240 is transformed into the hybrid structure, the annealing process may be performed after the plasma treatment. In some embodiments, the annealing process may have a process temperature in a range from about 550° C. to about 700° C. An excessively low process temperature (e.g., lower than 550° C.) may be unable to achieve a desired crystallization result, while an excessively high process temperature (e.g., higher than 700° C.) may result in diffusion of the dopants in the sacrificial layers 206 into the semiconductor layers 204. The gas flow and the process temperatures may be controlled to obtain desired crystalline and film properties. In some embodiments, the step of transforming the dielectric isolation layer 240 into the hybrid structure (i.e., step S5) may be performed before the step of forming the gate spacer (i.e., step S4), and this disclosure is not limited in this respect.

Figure 26:
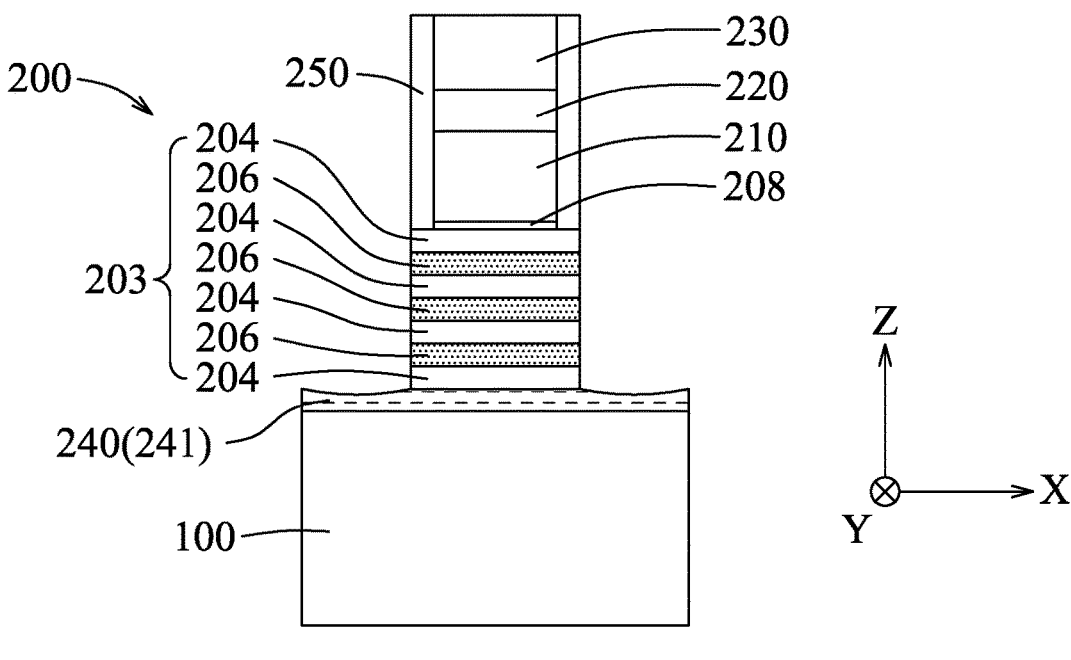
Figure 27:
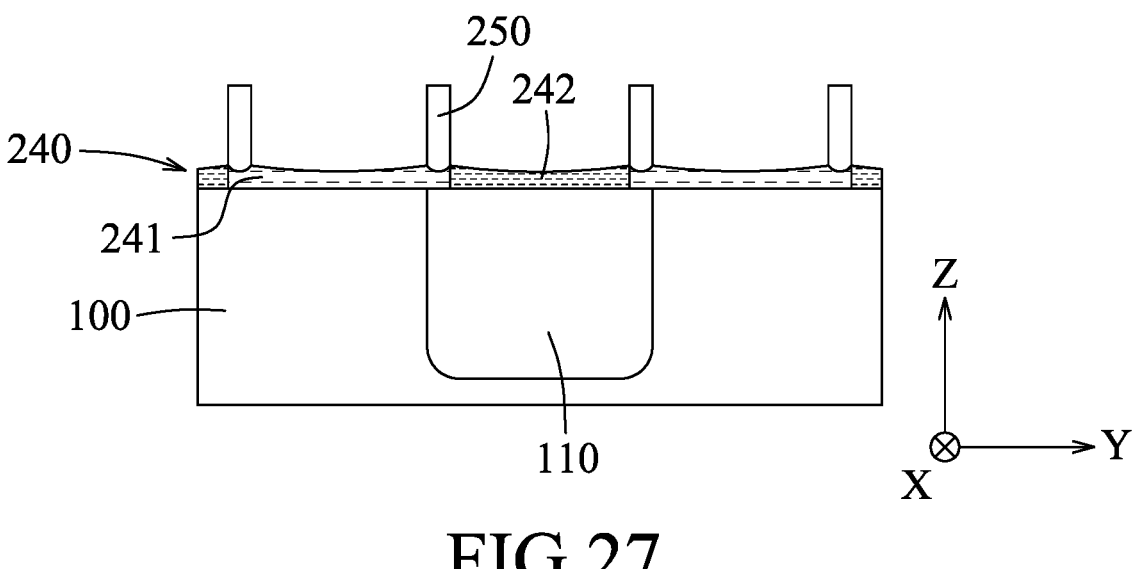
Figure 28:
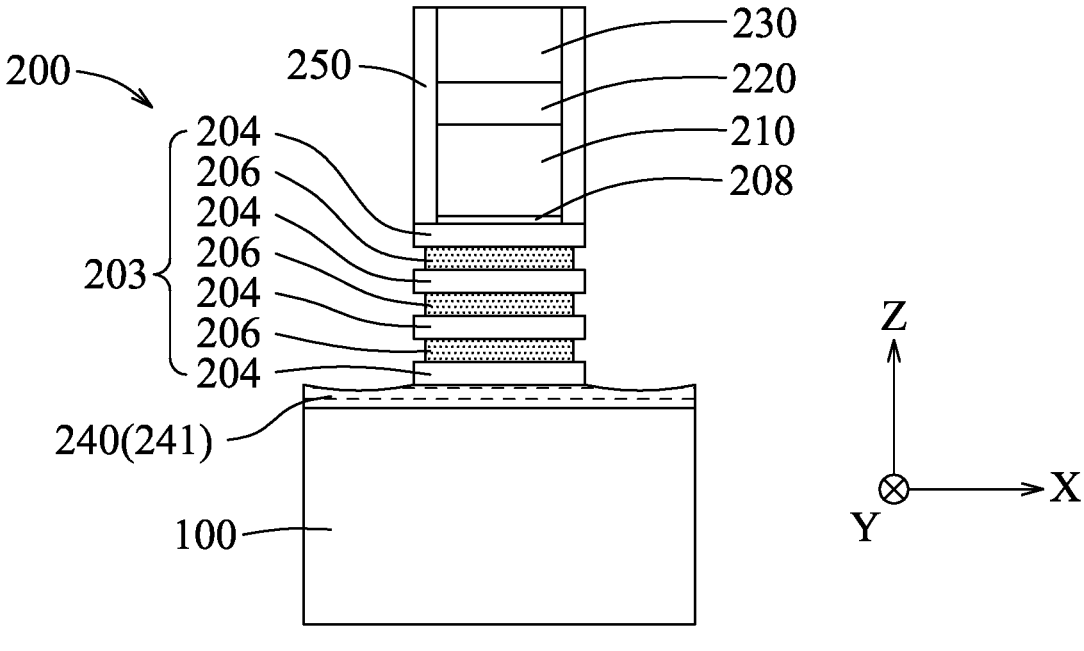
Figure 29:
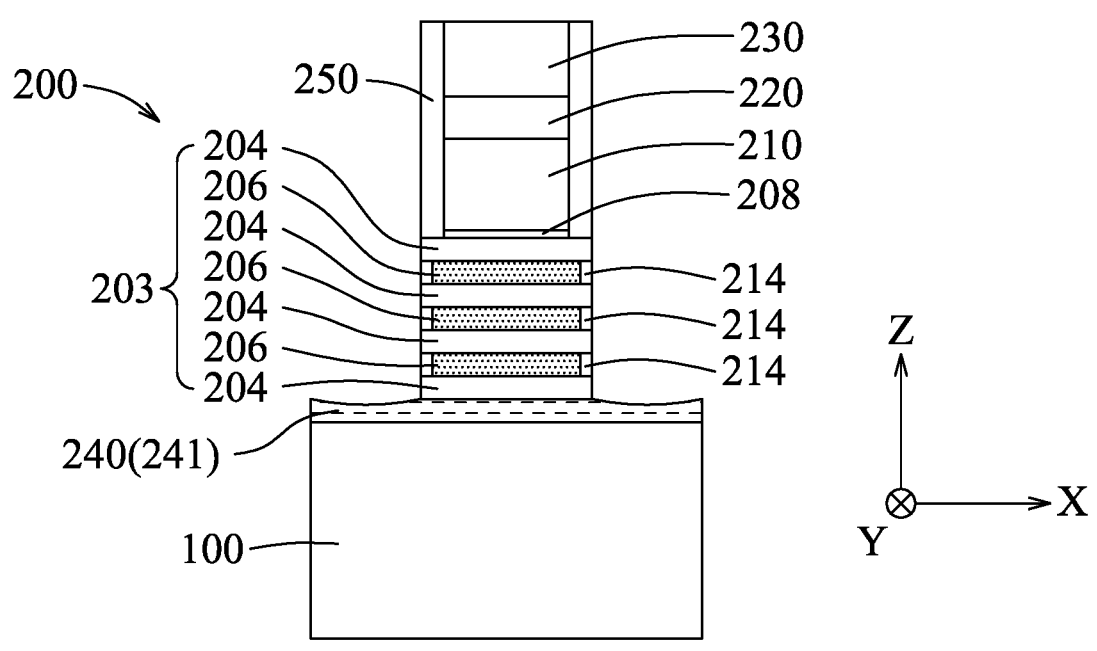
Figure 30:
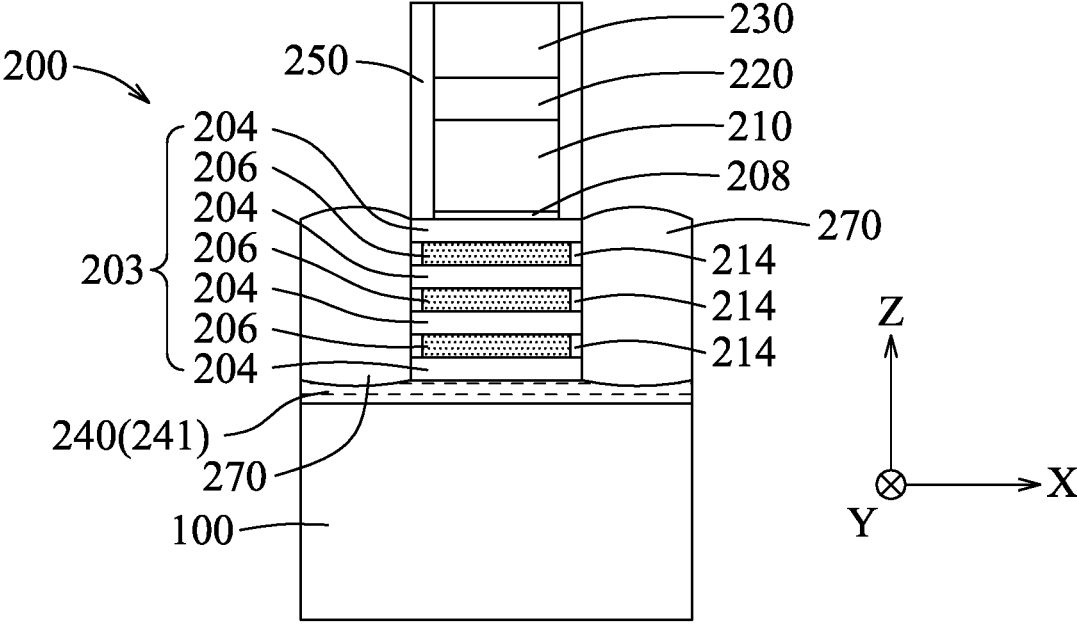
Figure 31:
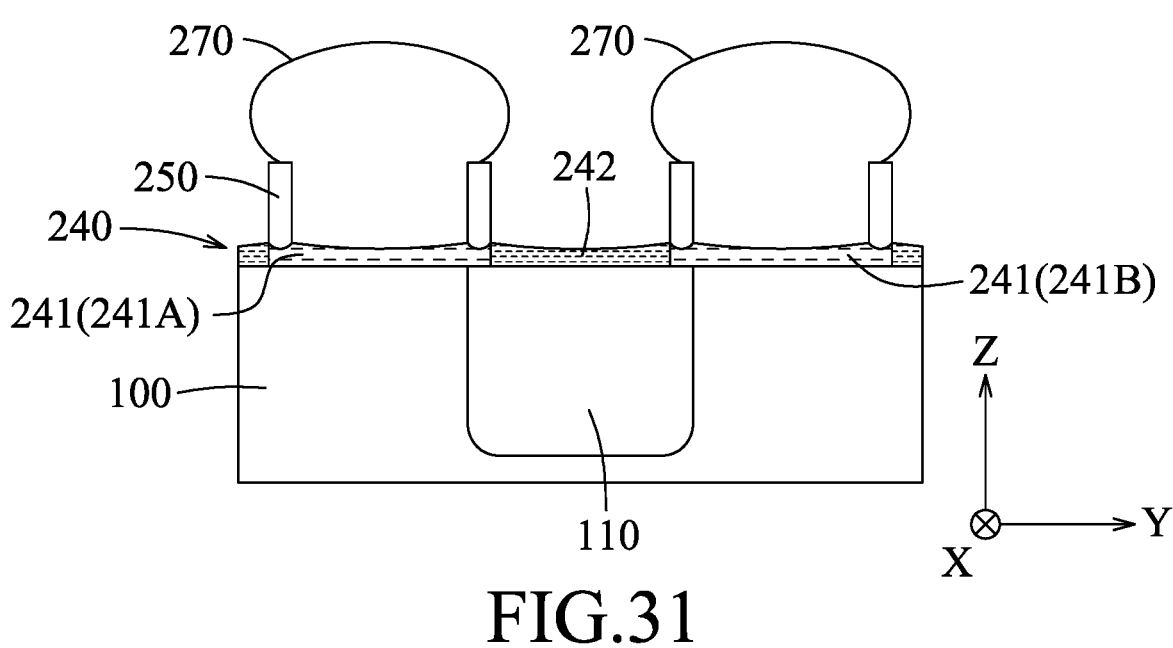

In step S6, as illustrated in FIGS. 26 through 31, for each of the fin features 200, a pair of source/drain (S/D) features 270 are formed to be connected to the fin portion 203 of the fin feature 200 and to be disposed over the dielectric isolation layer 240. FIGS. 26 and 27 respectively illustrate the X-cut view and the second Y-cut view of an intermediate structure of the semiconductor circuit structure for a step of, for each fin feature 200, etching a part of the fin portion 203 (i.e., the semiconductor layers 204 and the sacrificial layers 206 in the illustrative embodiment) of the fin feature 200 that is outside of a coverage of the dummy gate feature 210 to form source/drain spaces. In some embodiments, the etching of the part of the fin portion 203 may be performed using, for example, anisotropic dry etching, other suitable techniques, or any combination thereof. The process for etching the part of the fin portion 203 may slightly recess the dielectric isolation layer 240, so as to form some shallow indentations in a top surface of the dielectric isolation layer 240. In some embodiments, the etching process is controlled to make the shallow indentations have a depth smaller than 1 nm, so as to minimize adverse effects on the dielectric isolation layer 240. FIG. 28 illustrates the X-cut view of an intermediate structure of the semiconductor circuit structure for a step of, for each fin feature 200, etching the sacrificial layers 206 to form inner spacer recesses in the fin portion 203 of the fin feature 200. In some embodiments, the inner spacer recesses may be formed using, for example, isotropic etching, such as wet etching, other suitable techniques, or any combination thereof. FIG. 29 illustrates the X-cut view of an intermediate structure of the semiconductor circuit structure for a step of, for each fin feature 200, forming inner spacers 214 in the inner spacer recesses. An inner spacer layer may be first deposited to fill the inner spacer recesses using, for example, CVD, ALD, other suitable techniques, or any combination thereof, and may include, for example, silicon oxide, silicon nitride, oxygen-doped silicon nitride, carbon-doped silicon nitride, silicon carbide, other suitable materials, or any combination thereof. Then, a portion of the inner spacer layer that is outside of the inner spacer recesses may be etched using, for example, wet etching, dry etching, other suitable techniques, or any combination thereof, so as to form the inner spacers 214. FIGS. 30 and 31 respectively illustrate the X-cut view and the second Y-cut view of an intermediate structure of the semiconductor circuit structure for a step of performing an epitaxy process to form, for each fin feature 200, the source/drain features 270 in the source/drain spaces. In some embodiments, the source/drain features may include, for example, Si, SiGe, SiC, other suitable materials, or any combination thereof.

Figure 32:
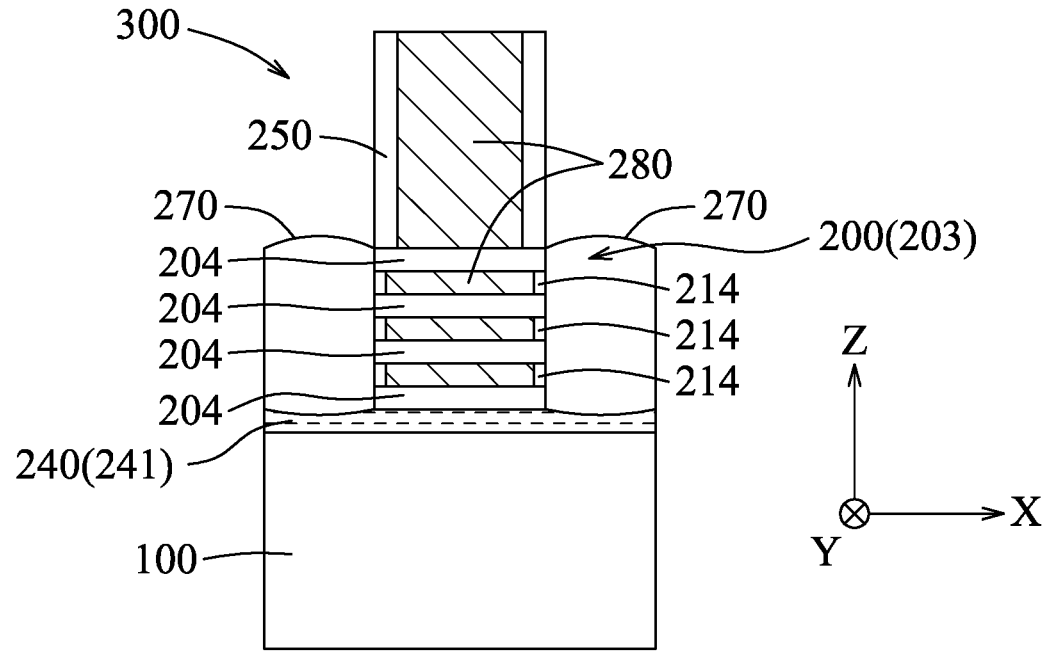
Figure 33:
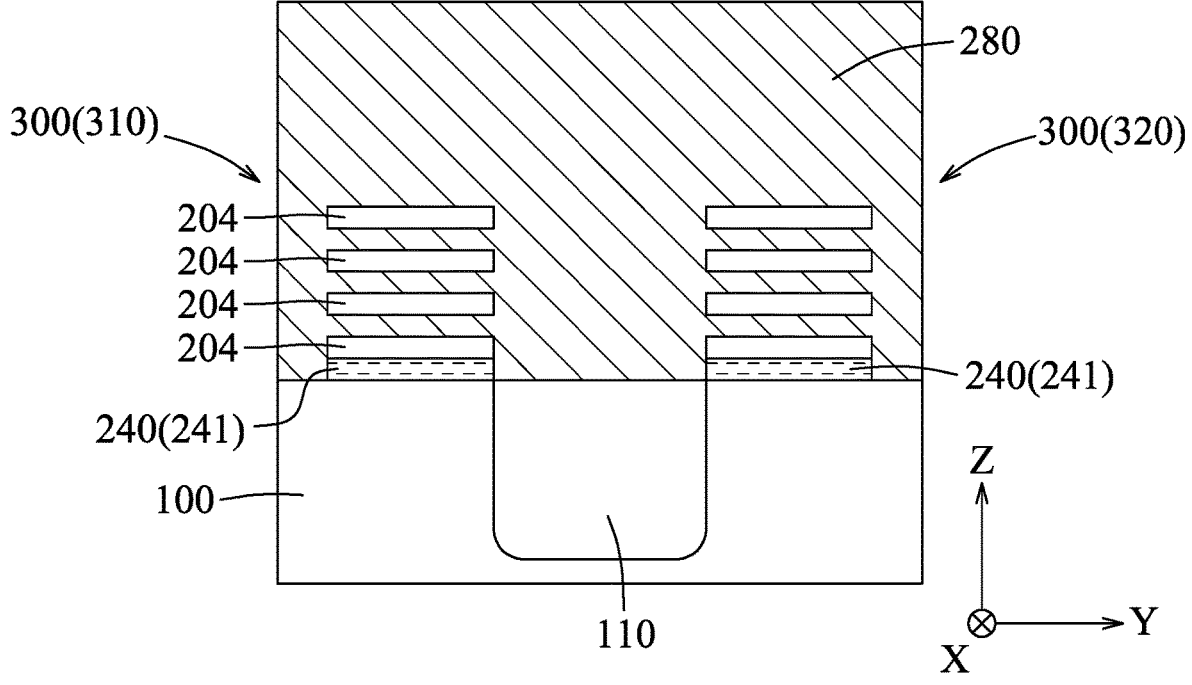

In step S7, as illustrated in FIGS. 32 and 33, the dummy gate feature 210 (see FIGS. 17 and 30) is processed to form a gate electrode feature 280 on the fin portion 203 of each fin feature 200 using, for example, a gate replacement process. FIGS. 32 and 33 respectively illustrate the X-cut view and the first Y-cut view of the semiconductor circuit structure at this stage. In some embodiments, the dielectric layer 230, the hard mask layer 220, the dummy gate feature 210, the etch stop layer 208, and the sacrificial layers 206 of the fin portion 203 of each fin feature 200 are removed in sequence at the beginning. Then, a high-k dielectric film is conformally deposited on the semiconductor layers 204, and a metal layer is subsequently deposited to fill the spaces that were originally occupied by the dielectric layer 230, the hard mask layer 220, the dummy gate feature 210, the etch stop layer 208, and the sacrificial layers 206, so as to form the gate electrode feature 280 that is constituted by the high-k dielectric film and the metal layer. As a result, the semiconductor devices 300 of the semiconductor circuit structure are formed, where the semiconductor devices 300 include a first semiconductor device 310 and a second semiconductor device 320 that are exemplified as GAAFETs in the illustrative embodiment.

Figure 34:
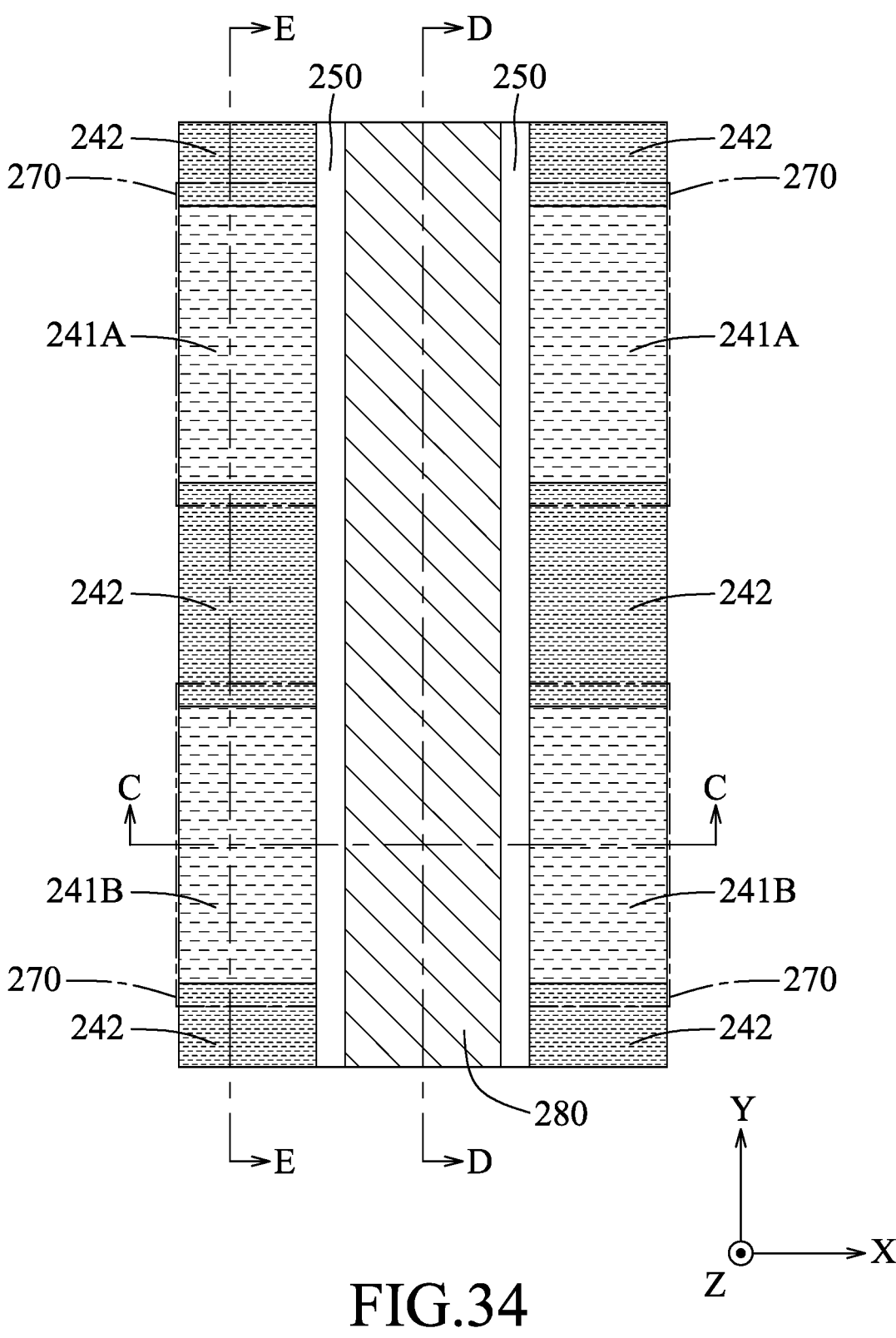
FIG. 34 is a top view of the semiconductor circuit structure in accordance with some embodiments.

Referring to FIGS. 31 through 34, where FIG. 34 illustrates a top view of the semiconductor circuit structure, the semiconductor circuit structure includes the dielectric isolation layer 240 disposed on the semiconductor substrate 100, the first semiconductor device 310 and the second semiconductor device 320. In FIG. 34, the source/drain features 270 of the first semiconductor device 310 and the second semiconductor device 320 are illustrated using chain lines so that the dielectric isolation layer 240 is clearly shown. FIG. 32 may be deemed the X-cut view of the semiconductor circuit structure taken along line C-C in FIG. 34. FIG. 33 may be deemed the first Y-cut view of the semiconductor circuit structure taken along line D-D in FIG. 34. FIG. 31 may be deemed the second Y-cut view of the semiconductor circuit structure taken along line E-E in FIG. 34. The first semiconductor device 310 includes a channel feature (denoted by the reference numeral 204 hereinafter because the channel feature is constituted by the semiconductor layers 204) that is disposed on the dielectric isolation layer 240, the gate electrode feature 280 that is disposed on the channel feature 204, and the source/drain features 270 that are disposed on the dielectric isolation layer 240 and that are connected to the channel feature 204. In the illustrative embodiment, the second semiconductor device 320 has the same structure as the first semiconductor device 310, so details thereof are not repeated herein for the sake of brevity. The gate electrode feature 280 is common to the first semiconductor device 310 and the second semiconductor device 320, and is connected to the semiconductor substrate 100. The channel feature 204 and the source/drain features 270 of each of the first semiconductor device 310 and the second semiconductor device 320 are electrically isolated from the semiconductor substrate 100 by the dielectric isolation layer 240. The dielectric isolation layer 240 has a portion 241A that is disposed between the first semiconductor device 310 and the semiconductor substrate 100 (namely, covered by the first semiconductor device 310), a portion 241B that is disposed between the second semiconductor device 320 and the semiconductor substrate 100 (namely, covered by the second semiconductor device 320), and a portion 242 that interconnects the portion 241A and the portion 241B of the dielectric isolation layer, and that is outside of coverages of the first semiconductor device 310 and the second semiconductor device 320. In some embodiments, the portions 241A, 241B and 242 are made of the same dielectric material (e.g., metal oxide or metal nitride). In some embodiments, the portion 241A and the portion 241B of the dielectric isolation layer 240 are made of a first dielectric material (e.g., metal oxide or metal nitride), and the portion 242 of the dielectric isolation layer 240 is made of a second dielectric material (e.g., metal nitride when the first dielectric material is metal oxide, or metal oxide when the first dielectric material is metal nitride) that is different from the first dielectric material.

As a result, mesa leakage among the source/drain features 270 and the channel features 204 of the first semiconductor device 310 and the second semiconductor device 320 may be reduced by virtue of the dielectric isolation layer 240 that is formed between the semiconductor devices 310, 320 and the semiconductor substrate 100. In some embodiments, the dielectric isolation layer 240 may be formed into a hybrid structure, and thus may have the advantages of different dielectric materials. In some embodiments, the hybrid structure may be formed using a plasma treatment. In some embodiments, an annealing process may be performed for crystallization of the dielectric isolation layer 240, so as to improve the film properties of the dielectric isolation layer 240.

In accordance with some embodiments, a method for forming a semiconductor device is provided. In one step, a fin feature is formed on a semiconductor substrate, and a dummy gate feature is formed over the fin feature. The fin feature includes a sacrificial portion disposed over the semiconductor substrate, and a fin portion disposed over the sacrificial portion. The dummy gate feature is disposed over and connected to the fin feature and the semiconductor substrate. In one step, the sacrificial portion of the fin feature is removed to form a gap between the semiconductor substrate and the fin portion of the fin feature. In one step, a dielectric isolation layer that fills the gap between the semiconductor substrate and the fin portion of the fin feature is formed for electrically isolating the fin portion of the fin feature from the semiconductor substrate. In one step, source/drain features that are connected to the fin portion of the fin feature are formed over the dielectric isolation layer. In one step, the dummy gate feature is processed to form a gate electrode feature on the fin portion of the fin feature.

In accordance with some embodiments, an annealing process is performed between the step of forming the dielectric isolation layer and the step of forming the source/drain features.

In accordance with some embodiments, in the step of forming the source/drain features, a part of the fin portion of the fin feature that is outside of a coverage of the dummy gate feature is etched to form source/drain spaces; and an epitaxy process is performed to form the source/drain features in the source/drain spaces. The dielectric isolation layer is made of a first dielectric material, and a part of the dielectric isolation layer that is outside of a coverage of the fin feature is transformed from the first dielectric material into a second dielectric material that is different from the first dielectric material between the step of forming the dielectric isolation layer and the step of etching the part of the fin portion of the fin feature.

In accordance with some embodiments, a plasma treatment is used to transform the part of the dielectric isolation layer from the first dielectric material into the second dielectric material.

In accordance with some embodiments, each of the first dielectric material and the second dielectric material is a metal-based dielectric material.

In accordance with some embodiments, the first dielectric material is one of a metal-based oxide and a metal-based nitride. The plasma treatment uses a gas including nitrogen when the first dielectric material is the metal-based oxide, and uses a gas including oxygen when the first dielectric material is the metal-based nitride.

In accordance with some embodiments, the gas used in the plasma treatment includes one of $N_2$ and $NH_3$ when the first dielectric material is the metal-based oxide, and includes one of $O_2$ and $O_3$ when the first dielectric material is the metal-based nitride.

In accordance with some embodiments, the metal-based dielectric material includes one of Al, Hf and Zr.

In accordance with some embodiments, an annealing process is performed between the plasma treatment and the step of forming the source/drain features.

In accordance with some embodiments, the annealing process has a process temperature ranging from 550° C. to 700° C.

In accordance with some embodiments, the method includes the following steps between the step of forming the dielectric isolation layer and the step of transforming the part of the dielectric isolation layer from the first dielectric material into the second dielectric material. In one step, a masking layer is coated onto the dielectric isolation layer. In one step, an etching back process is performed to remove a portion of the masking layer that is disposed over the fin feature. In one step, a portion of the dielectric isolation layer that is disposed over the fin feature is etched. In one step, a remaining portion of the masking layer is removed.

In accordance with some embodiments, the sacrificial portion of the fin feature has a thickness in a range from 3 nm to 10 nm.

In accordance with some embodiments, the fin portion of the fin feature is a multilayer stack that includes multiple semiconductor layers and multiple sacrificial layers that are alternately stacked together. The sacrificial portion of the fin feature and the sacrificial layers of the fin portion of the fin feature are doped layers that have a same base material and a same dopant material, and a doping concentration of the sacrificial portion of the fin feature is different from that of the sacrificial layers of the fin portion of the fin feature.

In accordance with some embodiments, a semiconductor circuit structure includes a dielectric isolation layer that is disposed on a semiconductor substrate, and a semiconductor device. The semiconductor device includes a channel feature disposed on the dielectric isolation layer, a gate electrode feature disposed on the channel feature, and a pair of source/drain features disposed on the dielectric isolation layer and connected to the channel feature. The channel feature and the source/drain features of the semiconductor device are electrically isolated from the semiconductor substrate by the dielectric isolation layer.

In accordance with some embodiments, a first portion of the dielectric isolation layer that is covered by the semiconductor device is made of a first dielectric material. A second portion of the dielectric isolation layer that is outside of a coverage of the semiconductor device is made of a second dielectric material that is different from the first dielectric material.

In accordance with some embodiments, the first dielectric material is one of a metal-based oxide and a metal-based nitride. The second dielectric material is a metal-based nitride when the first dielectric material is a metal-based oxide, and is a metal-based oxide when the first dielectric material is a metal-based nitride. The first dielectric material and the second dielectric material have a same metal component.

In accordance with some embodiments, the metal component includes one of Al, Hf and Zr.

In accordance with some embodiments, the dielectric isolation layer has a thickness in a range from 3 nm to 10 nm.

In accordance with some embodiments, the gate electrode feature is connected to the semiconductor substrate.

In accordance with some embodiments, a semiconductor circuit structure includes a dielectric isolation layer that is disposed on a semiconductor substrate, and a first semiconductor device and a second semiconductor device. Each of the first semiconductor device and the second semiconductor device includes a channel feature disposed on the dielectric isolation layer, a gate electrode feature disposed on the channel feature; and a pair of source/drain features disposed on the dielectric isolation layer and connected to the channel feature. The gate electrode features of the first semiconductor device and the second semiconductor device are connected to each other and are connected to the semiconductor substrate. The channel feature and the source/drain features of each of the first semiconductor device and the second semiconductor device are electrically isolated from the semiconductor substrate by the dielectric isolation layer. The dielectric isolation layer has a first portion that is disposed between the first semiconductor device and the semiconductor substrate, a second portion that is disposed between the second semiconductor device and the semiconductor substrate, and a third portion that interconnects the first portion and the second portion of the dielectric isolation layer. The first portion and the second portion of the dielectric isolation layer are made of a first dielectric material, and the third portion of the dielectric isolation layer is made of a second dielectric material that is different from the first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising steps of:

forming a fin feature on a semiconductor substrate and forming a dummy gate feature over the fin feature, wherein the fin feature includes a sacrificial portion disposed over the semiconductor substrate, and a fin portion disposed over the sacrificial portion, and the dummy gate feature is disposed over and connected to the fin feature and the semiconductor substrate;

removing the sacrificial portion of the fin feature after the dummy gate feature is formed over the fin feature, thereby forming a gap between the semiconductor substrate and the fin portion of the fin feature;

forming a dielectric isolation layer that fills the gap between the semiconductor substrate and the fin portion of the fin feature for electrically isolating the fin portion of the fin feature from the semiconductor substrate;

forming, over the dielectric isolation layer, source/drain features that are connected to the fin portion of the fin feature; and removing and replacing the dummy gate feature to form a gate electrode feature on the fin portion of the fin feature.

2. The method according to claim 1, further comprising, between the step of forming the dielectric isolation layer and the step of forming the source/drain features, a step of performing an annealing process.

3. The method according to claim 1, wherein the step of forming the source/drain features includes:

etching a part of the fin portion of the fin feature that is outside of a coverage of the dummy gate feature to form source/drain spaces; and performing an epitaxy process to form the source/drain features in the source/drain spaces;

wherein the dielectric isolation layer is made of a first dielectric material, and the method further comprises, between the step of forming the dielectric isolation layer and the step of etching the part of the fin portion of the fin feature, a step of transforming a part of the dielectric isolation layer that is outside of a coverage of the fin feature from the first dielectric material into a second dielectric material that is different from the first dielectric material.

4. The method according to claim 3, wherein a plasma treatment is used to transform the part of the dielectric isolation layer from the first dielectric material into the second dielectric material.

5. The method according to claim 4, wherein each of the first dielectric material and the second dielectric material is a metal-based dielectric material.

6. The method according to claim 5, wherein the first dielectric material is one of a metal-based oxide and a metal-based nitride; and wherein the plasma treatment uses a gas including nitrogen when the first dielectric material is the metal-based oxide, and uses a gas including oxygen when the first dielectric material is the metal-based nitride.

7. The method according to claim 6, wherein the gas used in the plasma treatment includes one of $N_2$ and $NH_3$ when the first dielectric material is the metal-based oxide, and includes one of $O_2$ and $O_3$ when the first dielectric material is the metal-based nitride.

8. The method according to claim 5, wherein the metal-based dielectric material includes one of Al, Hf and Zr.

9. The method according to claim 4, further comprising, between the plasma treatment and the step of forming the source/drain features, a step of performing an annealing process.

10. The method according to claim 9, wherein the annealing process has a process temperature ranging from 550° C. to 700° C.

11. The method according to claim 3, further comprising, between the step of forming the dielectric isolation layer and the step of transforming the part of the dielectric isolation layer from the first dielectric material into the second dielectric material, steps of:

coating a masking layer onto the dielectric isolation layer;

performing an etching back process to remove a portion of the masking layer that is disposed over the fin feature;

etching a portion of the dielectric isolation layer that is disposed over the fin feature; and removing a remaining portion of the masking layer that covers the part of the dielectric isolation layer.

12. The method according to claim 1, wherein the sacrificial portion of the fin feature has a thickness in a range from 3 nm to 10 nm.

13. The method according to claim 1, wherein the fin portion of the fin feature is a multilayer stack that includes multiple semiconductor layers and multiple sacrificial layers that are alternately stacked together; and wherein the sacrificial portion of the fin feature and the sacrificial layers of the fin portion of the fin feature are doped layers that have a same base material and a same dopant material, and a doping concentration of the sacrificial portion of the fin feature is different from that of the sacrificial layers of the fin portion of the fin feature.

14. A method for forming a semiconductor circuit structure, comprising steps of:

forming a first sacrificial feature over a semiconductor substrate, and a first semiconductor feature over the first sacrificial feature, where the first sacrificial feature separates the first semiconductor feature from the semiconductor substrate;

removing the first sacrificial feature so as to disconnect the semiconductor substrate from a surface of the semiconductor feature that faces the semiconductor substrate by eliminating physical connections formed by the first sacrificial feature, thereby forming a gap between the semiconductor substrate and the semiconductor feature;

depositing a metal-based dielectric layer on the semiconductor substrate, wherein the metal-based dielectric layer is made of a first metal-based dielectric material, and a portion of the metal-based dielectric layer that fills the gap forms a first metal-based dielectric feature;

forming first source/drain features that are connected to the first semiconductor feature; and forming a first gate feature on the first semiconductor feature, wherein the method comprises a step of transforming another portion of the metal-based dielectric layer that is outside of a coverage of the semiconductor feature from the first metal-based dielectric material into a second metal-based dielectric material which is different from the first metal-based dielectric material.

15. The method according to claim 14, wherein the first metal-based dielectric feature separates the first source/drain features from the semiconductor substrate.

16. The method according to claim 15, further comprising steps of:

forming a second sacrificial feature over the semiconductor substrate, and a second semiconductor feature over the second sacrificial feature, where the second sacrificial feature separates the second semiconductor feature from the semiconductor substrate;

replacing the second sacrificial feature with a second metal-based dielectric feature that is same as the first metal-based dielectric feature in terms of material;

forming second source/drain features that are connected to the second semiconductor feature;

forming a second gate feature on the second semiconductor feature; and forming a third metal-based dielectric feature that interconnects the first metal-based dielectric feature and the second metal-based dielectric feature, wherein the third metal-based dielectric feature is different from the first metal-based dielectric feature and the second metal-based dielectric feature in terms of material.

17. The method according to claim 16, wherein each of the first metal-based dielectric feature and the second metal-based dielectric feature includes an element of one of aluminum, hafnium and zirconium, and an element of one of nitrogen and oxygen; and wherein the third metal-based dielectric feature includes an element of said one of aluminum, hafnium and zirconium, and an element of the other one of nitrogen and oxygen.

18. A method for forming a semiconductor circuit structure, comprising steps of:

forming a sacrificial feature over a semiconductor substrate;

forming a first channel feature and a second channel feature over the sacrificial feature, wherein the first channel feature and the second channel feature are spaced apart from each other in a direction parallel to a surface of the semiconductor substrate;

replacing the sacrificial feature with a metal-based dielectric feature;

forming first source/drain features and second source/drain features over the metal-based dielectric feature, where the first source/drain features are connected to the first channel feature, and the second source/drain features are connected to the second channel feature;

transforming a portion of the metal-based dielectric feature from a first metal-based dielectric material into a second metal-based dielectric material that is different from the first metal-based dielectric material, wherein the portion of the metal-based dielectric feature is disposed between one of the first source/drain features and one of the second source/drain features when viewed from top; and forming a first gate feature and a second gate feature on the first channel feature and the second channel feature, respectively.

19. The method according to claim 18, wherein the first metal-based dielectric material is one of a metal oxide and a metal nitride, and the second metal-based dielectric material is the other one of the metal oxide and the metal nitride.

20. The method according to claim 14, wherein the first metal-based dielectric material is one of a metal oxide and a metal nitride, and the second metal-based dielectric material is the other one of the metal oxide and the metal nitride.

* * * * *